United States Patent
Sano et al.

(10) Patent No.: US 12,457,873 B2
(45) Date of Patent: Oct. 28, 2025

(54) ORGANIC LIGHT-EMITTING DEVICE, DISPLAY APPARATUS, PHOTOELECTRIC CONVERSION APPARATUS, AND ELECTRONIC APPARATUS

(71) Applicant: CANON KABUSHIKI KAISHA, Tokyo (JP)

(72) Inventors: Hiroaki Sano, Kanagawa (JP); Akira Okita, Kanagawa (JP); Yojiro Matsuda, Kanagawa (JP); Shoma Hinata, Kanagawa (JP); Kentaro Ito, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 932 days.

(21) Appl. No.: 17/503,064

(22) Filed: Oct. 15, 2021

(65) Prior Publication Data
US 2022/0123268 A1    Apr. 21, 2022

(30) Foreign Application Priority Data
Oct. 20, 2020    (JP) .................. 2020-176075

(51) Int. Cl.
*H10K 59/32*    (2023.01)
*H10F 39/00*    (2025.01)
(Continued)

(52) U.S. Cl.
CPC ......... *H10K 59/32* (2023.02); *H10F 39/8063* (2025.01); *H10F 39/807* (2025.01);
(Continued)

(58) Field of Classification Search
CPC .... H10K 50/856; H10K 50/858; H10K 59/38; H01L 27/14627; H01L 27/1463
See application file for complete search history.

(56) References Cited

U.S. PATENT DOCUMENTS

2012/0133575 A1* 5/2012 Hasegawa ............ H10K 59/879
                                                                    345/76
2012/0211775 A1* 8/2012 Hosoya .................. H10K 59/86
                                                                    257/40
(Continued)

FOREIGN PATENT DOCUMENTS

JP    2007258163 A    10/2007
JP    2014032817 A    2/2014
(Continued)

OTHER PUBLICATIONS

Park, J.H., et al., "New Bipolar Green Host Materials Containing Benzimidazole-Carbazole Moiety in Phosphorescent OLEDS", Bull. Korean Chem. Soc., 2011, pp. 841-846, vol. 32, No. 3.
(Continued)

*Primary Examiner* — William B Partridge
*Assistant Examiner* — David Paul Sedorook
(74) *Attorney, Agent, or Firm* — Canon U.S.A., Inc. IP Division

(57) ABSTRACT

An organic light-emitting device includes, on an insulating layer, a first lower electrode, an upper electrode, and an organic compound layer disposed between the first lower electrode and the upper electrode, wherein the organic compound layer includes a first light-emitting layer, a second light-emitting layer disposed between the first light-emitting layer and the upper electrode, and a first organic compound layer disposed between the first light-emitting layer and the second light-emitting layer, the first organic compound layer includes a second organic compound layer containing an alkali metal, and a third organic compound layer disposed between the second organic compound layer and the upper electrode and containing a compound having a lowest unoccupied molecular orbital level energy of −5.0 eV or less, and an orthogonal projection of the first organic compound layer onto the insulating layer is smaller than an
(Continued)

orthogonal projection of the first light-emitting layer onto the insulating layer.

29 Claims, 11 Drawing Sheets

(51) Int. Cl.
| | |
|---|---|
| *H10K 50/856* | (2023.01) |
| *H10K 50/858* | (2023.01) |
| *H10K 59/38* | (2023.01) |
| *H10K 59/65* | (2023.01) |
| *H10K 59/80* | (2023.01) |

(52) U.S. Cl.
CPC ......... *H10K 50/856* (2023.02); *H10K 50/858* (2023.02); *H10K 59/38* (2023.02); *H10K 59/65* (2023.02); *H10K 59/876* (2023.02); *H10K 59/878* (2023.02); *H10K 59/879* (2023.02)

(56) References Cited

U.S. PATENT DOCUMENTS

| | | | |
|---|---|---|---|
| 2012/0235144 A1* | 9/2012 | Choung | H10K 59/80523 438/22 |
| 2013/0183781 A1 | 7/2013 | Yoshinaga | |
| 2014/0065750 A1* | 3/2014 | Harikrishna Mohan | H10K 50/11 438/35 |
| 2017/0148860 A1* | 5/2017 | Park | H10K 50/844 |
| 2019/0123291 A1 | 4/2019 | Jeon | |
| 2019/0334115 A1* | 10/2019 | Matsuda | H10K 50/8426 |
| 2020/0358021 A1* | 11/2020 | Yamada | H10K 85/657 |
| 2022/0006057 A1* | 1/2022 | Itonaga | H10K 50/19 |

FOREIGN PATENT DOCUMENTS

| | | |
|---|---|---|
| JP | 2015130335 A | 7/2015 |
| JP | 2018026552 A | 2/2018 |
| JP | 2020004970 A | 1/2020 |
| KR | 20160119081 A | 10/2016 |
| KR | 20190044148 A | 4/2019 |
| KR | 20200012580 A | 2/2020 |
| KR | 20200013901 A | 2/2020 |
| WO | 2020110665 A1 | 6/2020 |
| WO | 2020232225 A1 | 11/2020 |

OTHER PUBLICATIONS

Gantenbein, M., et al., "New 4,4'-Bis(9-carbazolyl)-Biphenyl Derivatives with Locked Carbazole-Biphenyl Junctions: High-Triplet State Energy Materials", Chem. Mater., 2015, pp. 1772-1779, vol. 27.

Yuan, J., et al., "High efficiency organic light-emitting diodes based on HAT-CN/TAPC heterojunction charge generation layer as charge injectors", Semicond. Sci. Technol, 2019, vol. 34.

Namdas, E.B., et al., "Simple color tuning of phosphorescent dendrimer light emitting diodes", Applied Physics Letters, 2005, vol. 86.

Kroger, M., et al., "P-type doping of organic wide band gap materials by transition metal oxides: A case-study on Molybdenum trioxide", Organic Electronics, 2009, pp. 932-938, vol. 10.

Meyer, J., et al., "Transition Metal Oxides for Organic Electronics: Energetics, Device Physics and Applications", Adv. Mater. 2012, pp. 5408-5427, vol. 24.

Zhang, T., et al., "A CBP derivative as bipolar host for performance enhancement in phosphorescent organic light-emitting diodes", J. Mater. Chem. C., 2013, pp. 757-764, vol. 1.

Zhang, T., et al., "Stacking multiple connecting functional materials in tandem organic light-emitting diodes", Scientific Reports, 2017.

Yokoyama, K., et al., "Ultra-high-resolution 1058-ppi OLED displays with 2.78-in size using CAAC-IGZO FETs with tandem OLED device and single OLED device", Journal of the SID, 2016, pp. 159-167, vol. 24, No. 3.

Jiakun Yuan et al., High Efficiency Organic Light-Emitting Diodes Based on HAT-CN/TAPC Heterojunction Charge Generation Layer as Charge Injectors, Semiconductor Science and Technology, 2019.

* cited by examiner

ORGANIC LIGHT-EMITTING DEVICE, DISPLAY APPARATUS, PHOTOELECTRIC CONVERSION APPARATUS, AND ELECTRONIC APPARATUS

BACKGROUND OF THE INVENTION

Field of the Invention

The present invention relates to a light-emitting device in which leakage current between organic light-emitting elements is reduced, a display apparatus, a photoelectric conversion apparatus, and an electronic apparatus.

Description of the Related Art

The organic light-emitting element (also referred to as the organic electroluminescence element (organic EL element)) is an electronic element including a pair of electrodes and an organic compound layer disposed between the electrodes. From the pair of electrodes, electrons and holes are injected, to thereby generate excitons of a light-emitting organic compound in the organic compound layer; upon returning of the excitons to the ground state, the organic light-emitting element emits light.

With recent marked improvements of such organic light-emitting elements, low driving voltage, various emission wavelengths, high-speed responsiveness, and reduced thickness and reduced weight of light-emitting devices have been achieved.

FIG. 7 illustrates, as an example, an existing organic light-emitting device 700. The organic light-emitting device 700 includes, on an insulating layer 701, a lower electrode 702, a first stack 704, a charge generation layer 705, a second stack 706, an upper electrode 707, a protective layer 708, and a planarization layer 709. A pixel isolation layer 703 covers an end of the lower electrode 702. An electric field is applied between the lower electrode and the upper electrode, to thereby generate carriers in the charge generation layer; the carriers are supplied to the first stack and the second stack, to cause efficient emission from both of the light-emitting layer included in the first stack and the light-emitting layer included in the second stack.

Japanese Patent Laid-Open No. 2020-004970 (PTL 1) describes an organic light-emitting element including a plurality of stacks between a first electrode and a second electrode, and a charge generation layer between the plurality of stacks. PTL 1 states that a blue-light-emitting layer is formed as a common layer without being divided for subsidiary pixels, to thereby reduce the number of the high-resolution mask used.

In PTL 1, as illustrated in FIG. 7, the charge generation layer disposed between the plurality of stacks is continuously disposed as a common layer for pixels. However, application of an electric field to the charge generation layer causes generation of charges, and hence application of an electric field causes generation of charges also in regions between subsidiary pixels. The generated charges can reach, via an organic layer not divided for subsidiary pixels, adjacent pixels, to cause unintended emission.

SUMMARY OF THE INVENTION

The present invention provides an organic light-emitting device in which the regions of generating charges are reduced, to thereby reduce unintended emission.

The present invention provides an organic light-emitting device including, on an insulating layer, a first lower electrode, an upper electrode, and an organic compound layer disposed between the first lower electrode and the upper electrode, wherein the organic compound layer includes a first light-emitting layer, a second light-emitting layer disposed between the first light-emitting layer and the upper electrode, and a first organic compound layer disposed between the first light-emitting layer and the second light-emitting layer, the first organic compound layer includes a second organic compound layer containing an alkali metal, and a third organic compound layer disposed between the second organic compound layer and the upper electrode and containing a compound having a lowest unoccupied molecular orbital level energy of −5.0 eV or less, and an orthogonal projection of the first organic compound layer onto the insulating layer is smaller than an orthogonal projection of the first light-emitting layer onto the insulating layer.

Further features of the present invention will become apparent from the following description of exemplary embodiments with reference to the attached drawings.

DESCRIPTION OF THE EMBODIMENTS

Figure 1A:
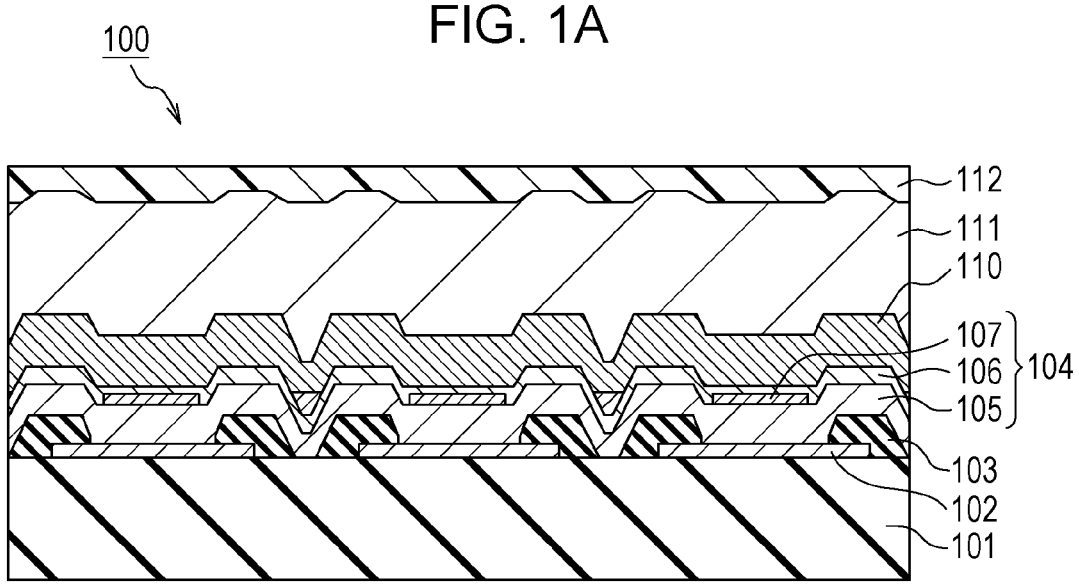
FIG. 1A is a schematic sectional view of an organic light-emitting device according to an embodiment of the present invention.

An organic light-emitting device according to an embodiment of the present invention includes, on an insulating layer, a first lower electrode, an upper electrode, and an organic compound layer disposed between the first lower electrode and the upper electrode, and has the following configuration.

The organic compound layer includes a first light-emitting layer, a second light-emitting layer disposed between the first light-emitting layer and the upper electrode, and a first organic compound layer disposed between the first light-emitting layer and the second light-emitting layer, wherein the first organic compound layer includes a second organic compound layer containing an alkali metal and a third organic compound layer disposed between the second organic compound layer and the upper electrode and containing a compound having a lowest unoccupied molecular orbital level energy of −5.0 eV or less. The orthogonal projection of the third organic compound layer onto the insulating layer is smaller than the orthogonal projection of the first light-emitting layer onto the insulating layer. Since the orthogonal projection of the third organic compound layer onto the insulating layer is small, generation of charges is reduced, compared with existing cases, so that reduction in unintended emission is achieved. The first organic compound layer can be disposed only in regions intended to emit light while the first organic compound layer is not disposed in regions not intended to emit light, namely regions between light-emitting elements. The regions in which the first organic compound layer is not disposed are regions in which at least one of the second organic compound layer or the third organic compound layer is not disposed and one of these layers may be disposed.

In this Specification, the light-emitting device includes a plurality of pixels. The pixels each include subsidiary pixels configured to emit individually rays of different colors. The subsidiary pixels may emit rays of different colors by individually passing divided rays through color filters or by having light-emitting regions having different structures in the subsidiary pixels. When the light-emitting device includes an organic light-emitting element, it may be referred to as an organic light-emitting device.

Such a subsidiary pixel includes an organic light-emitting element and a pixel circuit configured to control the emission luminance and emission period of the organic light-emitting element. The organic light-emitting element includes a lower electrode, an organic compound layer, an upper electrode, a protective layer, and a resin layer in this order, and may further include components such as color filters or optical members such as lenses. The edge of the lower electrode is covered with a pixel isolation layer. The pixel isolation layer is disposed in contact with the edge of the lower electrode and the side surface of the lower electrode. When the resin layer is formed for the purpose of planarization, it may be referred to as a planarization layer.

The light-emitting layer of an organic light-emitting element may be referred to on the basis of the emission color. For example, a light-emitting layer configured to emit blue light is referred to as a blue-light-emitting layer.

The lowest unoccupied molecular orbital level energy is an inherent energy of an organic compound and is also referred to as LUMO (Lowest Unoccupied Molecular Orbital). LUMO can also be estimated from the reduction potential of the organic compound or the difference between the bandgap and HOMO. HOMO (Highest Occupied Molecular Orbital) is the highest occupied molecular orbital level energy, and is an inherent energy value of an organic compound. HOMO can also be estimated from the ionization potential.

Hereinafter, the organic light-emitting device according to an embodiment of the present invention will be described. The present invention is not limited to the following descriptions, and those skilled in the art would easily understand that embodiments and details of the present invention can be modified in various ways without departing from the spirit and scope of the present invention. Therefore, construction of the present invention is not limited to the following descriptions of the embodiments.

Note that the drawings etc. may illustrate elements for easy understanding and the positions, sizes, ranges, etc. of the elements may not represent the actual positions, sizes, ranges, etc. Therefore, the invention disclosed is not necessarily limited to the positions, sizes, ranges, etc. disclosed in the drawings etc.

First Embodiment

Figure 1B:
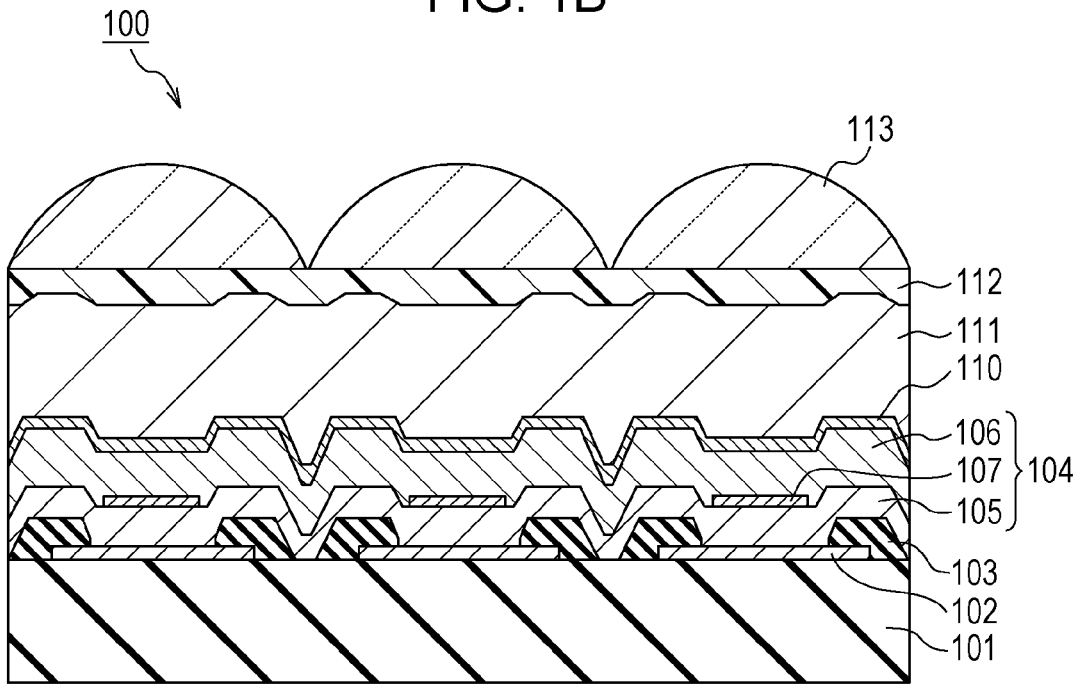
FIG. 1B is a schematic sectional view illustrating an example of an organic light-emitting device according to an embodiment of the present invention in which microlenses are disposed.

FIG. 1A is a schematic sectional view of an organic light-emitting device according to this embodiment. An organic light-emitting device 100 includes, on a substrate, an insulating layer 101, a plurality of lower electrodes 102, a pixel isolation layer 103, an organic compound layer 104, an upper electrode 110, a protective layer 111, and a resin layer 112. A single lower electrode and overlying elements that are a pixel isolation layer, an organic compound layer, an upper electrode, a protective layer, and a resin layer constitute a structure that may be referred to as an organic light-emitting element. In FIG. 1A, the reference signs are described only for the rightmost organic light-emitting element; however, it is appreciated that, for the other organic light-emitting elements, like elements are denoted by like reference signs. The plurality of lower electrodes include a first lower electrode and a second lower electrode. FIG. 1B is a schematic sectional view of an organic light-emitting device in which microlenses 113 are additionally disposed. In the organic light-emitting device according to this embodiment, microlenses may or may not be disposed.

The organic compound layer 104 includes an organic compound layer 105 including a first light-emitting layer, an organic compound layer 106 including a second light-emitting layer, and a first organic compound layer 107, and is shared by the plurality of organic light-emitting elements. In other words, the organic compound layer 104 is disposed as a common layer for the plurality of organic light-emitting elements. More specifically, the orthogonal projection of the single organic compound layer onto the insulating layer overlaps the orthogonal projections of the plurality of lower electrodes onto the insulating layer.

The first organic compound layer 107 includes a second organic compound layer 108 containing an alkali metal and a third organic compound layer 109 disposed between the second organic compound layer and the upper electrode. The third organic compound layer 109 contains a compound having a lowest unoccupied molecular orbital level energy of −5.0 eV or less.

The first organic compound layer 107, which has the combination of the alkali metal and the compound having a lowest unoccupied molecular orbital level energy of −5.0 eV or less, functions as a charge generation layer. The alkali metal may be Li; this Li may be contained in the form of elemental metal, a portion of a compound, or a portion of an organic metal complex. Non-limiting examples of the compound having a lowest unoccupied molecular orbital level energy of −5.0 eV or less include hexaazatriphenylene compounds, radialene compounds, and hexafluoroquinodimethane. The lowest unoccupied molecular orbital level energy is low enough to extract electrons from the highest occupied molecular orbital of the second organic compound layer, to thereby cause generation of charges.

This embodiment describes the case where the lower electrode 102 is an anode, and hence the first organic compound layer is constituted by, from the insulating-layer side, the second organic compound layer and the third organic compound layer disposed in this order. Alternatively, when the lower electrode 102 is a cathode, the first organic compound layer may be constituted by, from the lower-electrode side, the third organic compound layer and the second organic compound layer disposed in this order. In other words, the third organic compound layer is disposed between the second organic compound layer and the anode.

In this embodiment, the first organic compound layers are disposed so as to have a one-to-one relationship with the lower electrodes, to provide, what is called, the side-by-side configuration. More specifically, the orthogonal projection of each first organic compound layer onto the insulating layer is included in the orthogonal projection of the corresponding lower electrode onto the insulating layer.

The first light-emitting layer may emit light of one of three primary colors. The first light-emitting layer may have a monolayer structure or a multilayer structure. The second light-emitting layer may emit light of one of three primary colors. The first light-emitting layer and the second light-emitting layer may emit white rays and the white rays may be individually passed through different color filters, for example.

For example, when the lower electrode is formed so as to reflect light to provide the optical interference effect, from the lower-electrode side, a blue-light-emitting layer, a green-light-emitting layer, and a red-light-emitting layer may be disposed in this wavelength order. Alternatively, in consideration of the balance of charges in the light-emitting element, the red-light-emitting layer, the green-light-emitting layer, and the blue-light-emitting layer may be disposed in this order. Such a combination of the light-emitting layers may be provided by disposing the light-emitting layers individually in the first light-emitting layer and the second light-emitting layer. For example, the first light-emitting layer may include the red-light-emitting layer and the green-light-emitting layer, and the second light-emitting layer may include the blue-light-emitting layer. Alternatively, the first light-emitting layer may include the red-light-emitting layer, and the second light-emitting layer may include the green-light-emitting layer and the blue-light-emitting layer.

The pixel isolation layer 103 is an insulating layer covering the edge of the first lower electrode 102. The first lower electrode 102 includes a first region in contact with the organic compound layer 104, and a second region in contact with the pixel isolation layer 103. The first region is also referred to as the opening of the pixel isolation layer.

The orthogonal projection of the first organic compound layer 107 onto the insulating layer 101 may be larger or smaller than the orthogonal projection of the first region onto the insulating layer. Of the first organic compound layer 107 and the first region, the magnitude of the smaller orthogonal projection onto the insulating layer is the magnitude of the light emission region.

The magnitude relationship between the first organic compound layer 107 and the first region can be determined by the magnitude relationship between the alignment error during vapor deposition and the first region.

When the positional accuracy of forming the first organic compound layer 107 is low, the first organic compound layer can have a smaller orthogonal projection onto the insulating layer than the first region. In this case, the orthogonal projection of the first organic compound layer 107 onto the insulating layer 101 is smaller than the orthogonal projection of the first region onto the insulating layer 101. Alternatively, the orthogonal projection of the third organic compound layer 109 onto the insulating layer 101 may be made smaller than the orthogonal projection of the first region onto the insulating layer 101 to thereby provide a smaller orthogonal projection of the first organic compound layer onto the insulating layer.

On the other hand, when the positional accuracy of forming the first organic compound layer 107 is high, the first organic compound layer can have a larger orthogonal projection onto the insulating layer than the first region. For the positional accuracy, the alignment error between the vapor deposition substrate and the vapor deposition mask may be considered. Depending on the magnitude of the alignment error, the above-described relationship may not be satisfied.

The upper electrode 110 can be a light-transmitting electrode. The upper electrode can be shared by the plurality of organic light-emitting elements. In other words, the upper electrode can be disposed as a common electrode for the plurality of organic light-emitting elements.

The protective layer 111 is disposed over the upper electrode 110 to reduce entry of, for example, moisture and oxygen into the organic light-emitting elements. The protective layer may be an organic layer or an inorganic layer, or may be a monolayer or a multilayer. A combination of an organic layer and an inorganic layer may be employed. The protective layer may be referred to as a sealing layer.

The resin layer 112 is disposed over the protective layer. The resin layer reduces irregularities of the protective layer that may be caused by a part of the organic light-emitting element such as the pixel isolation film. On the basis of the function of the resin layer, it may also be referred to as a planarization layer. Over the planarization layer, for example, a color filter, a microlens, and a light-transmitting substrate may be disposed. Between these members, resin layers may be disposed. These resin layers may be the same as or different from the resin layer 112.

The microlenses 113 are disposed over the resin layer. The microlenses improve the light extraction efficiency of the organic light-emitting device, and can change the emission direction of light. The microlenses can focus forwardly emission from the organic light-emitting elements. Specifically, emission from an organic compound layer in all directions is focused by the microlens in the direction perpendicular to the insulating layer. Thus, even when the light emission regions are reduced, high luminance in the forward direction can be maintained. In addition, even when variations in the formation positions of the first organic compound layers cause variations in the positions of the light emission regions, the microlenses maintain high forward luminance.

The organic light-emitting element 100 having such a configuration may be connected via the insulating layer 101 to a pixel circuit (not shown). The pixel circuit includes a transistor and controls the emission luminance and emission period of the organic light-emitting element. The transistor in the pixel circuit may be a transistor formed by doping a Si substrate with a dopant or a thin-film transistor. The pixel circuit controls the emission luminance and emission period of each organic light-emitting element, to perform the active matrix control. Alternatively, the pixel circuit may perform the passive control without transistors.

The organic light-emitting device according to this embodiment has, what is called, the pixelation or side-by-side configuration in which the first organic compound layer 107 is disposed for each subsidiary pixel. Thus, of the charges generated by the first organic compound layers, unnecessary charges are reduced, to thereby reduce leakage current to the adjacent subsidiary pixels or pixels. As a result, in the organic light-emitting device according to this embodiment, unintended emission can be reduced.

Second Embodiment

Figure 2A:
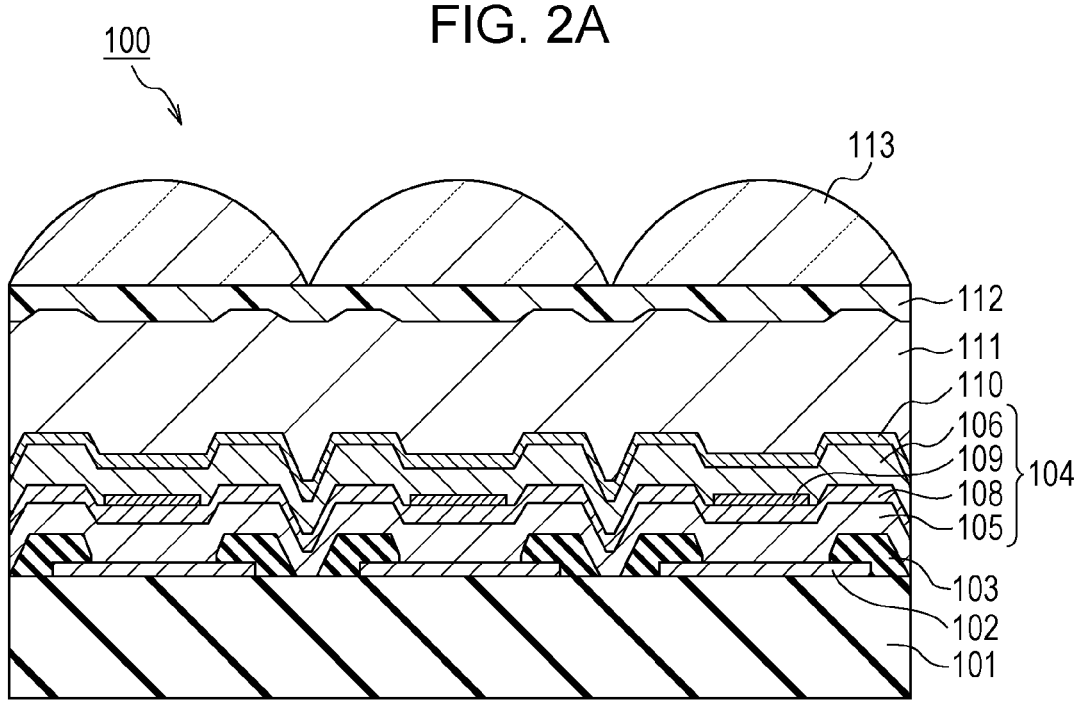
FIG. 2A is a schematic sectional view illustrating an example of an organic light-emitting device according to an embodiment of the present invention in which a first organic compound layer is not shared by a plurality of organic light-emitting elements in which, for example, a third organic compound layer is not shared by a plurality of organic light-emitting elements.

FIG. 2A is a schematic sectional view of an organic light-emitting device according to this embodiment. The organic light-emitting device according to this embodiment in FIG. 2A is the same as in the first embodiment except that the second organic compound layer 108 is disposed so as to be shared by the plurality of organic light-emitting elements. In FIG. 2A, the reference signs are described only for the rightmost organic light-emitting element; however, it is appreciated that, for the other organic light-emitting elements, like elements are denoted by like reference signs.

Figure 2B:
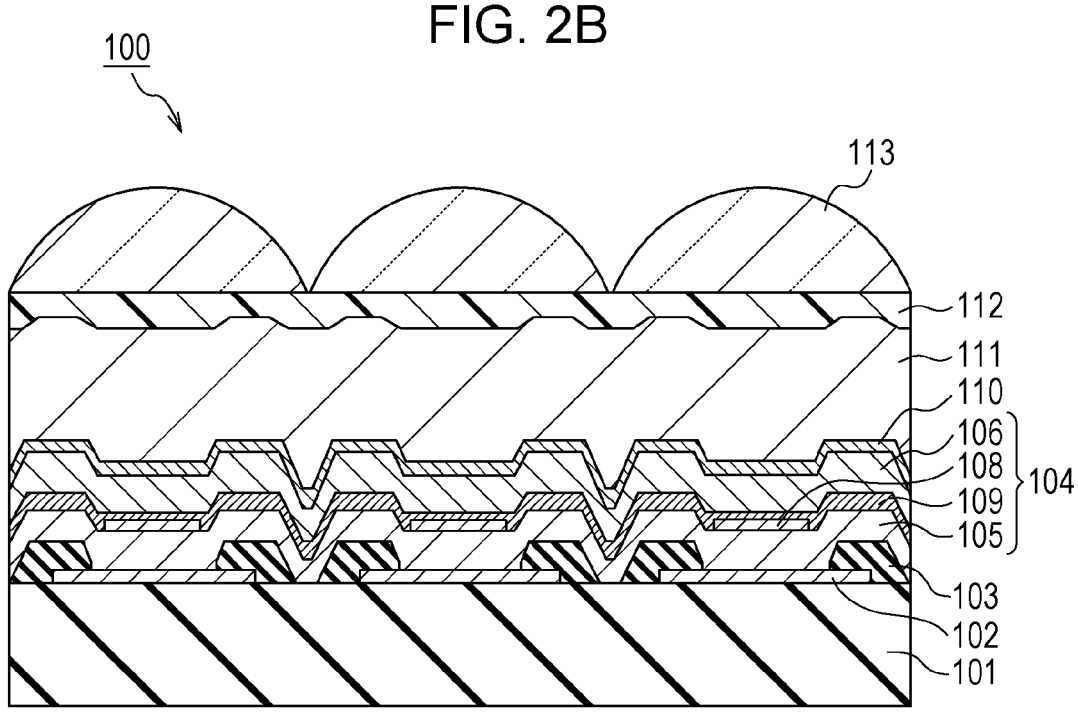
FIG. 2B is a schematic sectional view illustrating an example of an organic light-emitting device according to an embodiment of the present invention in which a first organic compound layer is not shared by a plurality of organic light-emitting elements in which, for example, a second organic compound layer is not shared by a plurality of organic light-emitting elements.

The phrase "the second organic compound layer 108 is disposed so as to be shared by the plurality of organic light-emitting elements" means that the second organic compound layer 108 is disposed so as to cover the plurality of lower electrodes. Specifically, the orthogonal projection of the single second organic compound layer onto the insulating layer overlaps the orthogonal projections of the plurality of the lower electrodes onto the insulating layer. The second organic compound layer is shared by the plurality of organic light-emitting elements, but the third organic compound layer is not shared by the plurality of organic light-emitting elements, and hence the first organic compound layer 107 is not shared by the plurality of organic light-emitting elements. Similarly, the third organic compound layer may be shared by the plurality of organic light-emitting elements, but the second organic compound layer may not be shared by the plurality of organic light-emitting elements. FIG. 2B is a schematic sectional view of an example of an organic light-emitting device according to an embodiment of the present invention in which the first organic compound layer is not shared by the plurality of organic light-emitting elements in which, for example, the second organic compound layer is not shared by the plurality of organic light-emitting elements.

The alkali metal contained in the second organic compound layer has high vapor deposition temperature; when the second organic compound layer is formed by vapor deposition as a layer not shared by the plurality of organic light-emitting elements, namely, a pixelation layer, the vapor deposition temperature is higher than the vapor deposition temperature of the organic compound. Such a high vapor deposition temperature may affect the vapor deposition mask used for pixelation, and hence, instead of forming the second organic compound layer as a pixelation layer, the third organic compound layer can be formed as a pixelation layer.

The organic light-emitting device according to this embodiment is illustrated so as to include microlenses; however, the microlenses are not necessarily disposed.

This embodiment provides advantages of the first embodiment easily, compared with the case of forming both of the second organic compound layer and the third organic compound layer in each of subsidiary pixels. Specifically, leakage current to the adjacent subsidiary pixels or pixels is reduced, to thereby reduce unintended emission.

Third Embodiment

Figure 3:
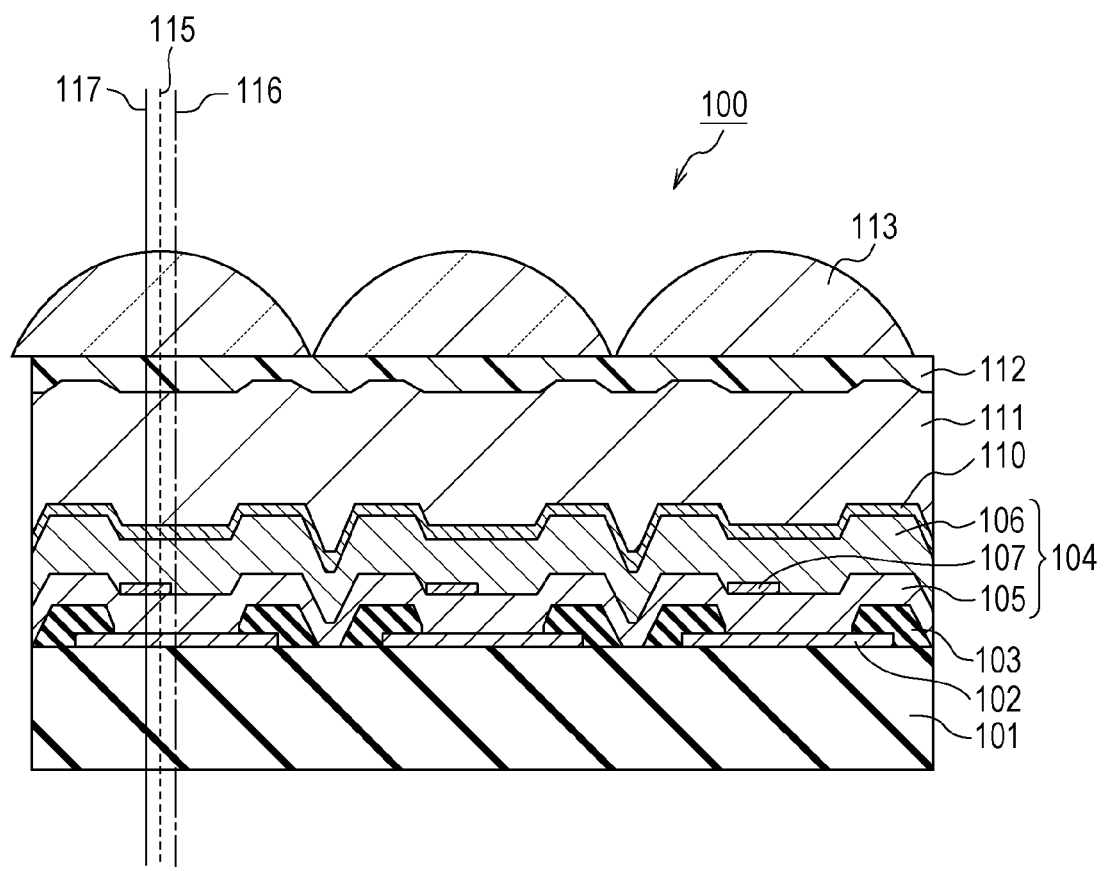
FIG. 3 is a schematic sectional view illustrating an example of an organic light-emitting device according to an embodiment of the present invention in which the uppermost point of a microlens, the midpoint of the opening of a pixel isolation layer, and the midpoint of a first organic compound layer are located at different positions.

FIG. 3 is a schematic sectional view of an organic light-emitting device according to this embodiment. The organic light-emitting device according to this embodiment is different from that of the first embodiment in that, in a section perpendicular to the insulating layer, an uppermost point 115 of a microlens is positioned between, in a direction parallel to the insulating layer, the midpoint of the first region of the lower electrode and the midpoint of the first organic compound layer. The first region of the lower electrode is, as described above, also referred to as the opening of the pixel isolation layer. In FIG. 3, reference signs are described only for the rightmost organic light-emitting element; however, it is appreciated that, for the other organic light-emitting elements, like elements are denoted by like reference signs.

In the organic light-emitting device according to this embodiment, in the section perpendicular to the insulating layer, a midpoint 117 of the first organic compound layer in the direction parallel to the insulating layer is located at a position, in the direction parallel to the insulating layer, different from that of the uppermost point 115 of the microlens. In addition, in the section perpendicular to the insulating layer, the midpoint 117 of the first organic compound layer in the direction parallel to the insulating layer is located at a position, in the direction parallel to the insulating layer, different from that of a midpoint 116 of the first region of the lower electrode in the direction parallel to the insulating layer.

Depending on the application of the organic light-emitting device, microlenses are disposed as illustrated in FIG. 3. In this case, in the configuration of this embodiment, emission from the first light-emitting layer and emission from the second light-emitting layer can be both efficiently used by the microlens. In the configuration of this embodiment, in the section perpendicular to the insulating layer, the uppermost point 115 of the microlens is positioned between, in the direction parallel to the insulating layer, the midpoint of the first region of the lower electrode and the midpoint of the first organic compound layer.

When the first organic compound layer is formed using a vapor deposition mask as illustrated in FIG. 3, misalignment of the vapor deposition mask may occur; thus, the configuration of the organic light-emitting device according to this embodiment can be employed.

In FIG. 3, as in the first embodiment, the first organic compound layers are individually disposed for the organic light-emitting elements; alternatively, as in the second embodiment, the second organic compound layer may be shared by the plurality of organic light-emitting elements. In other words, the third organic compound layers may be disposed in the form of pixelation layers.

Fourth Embodiment

Figure 4:
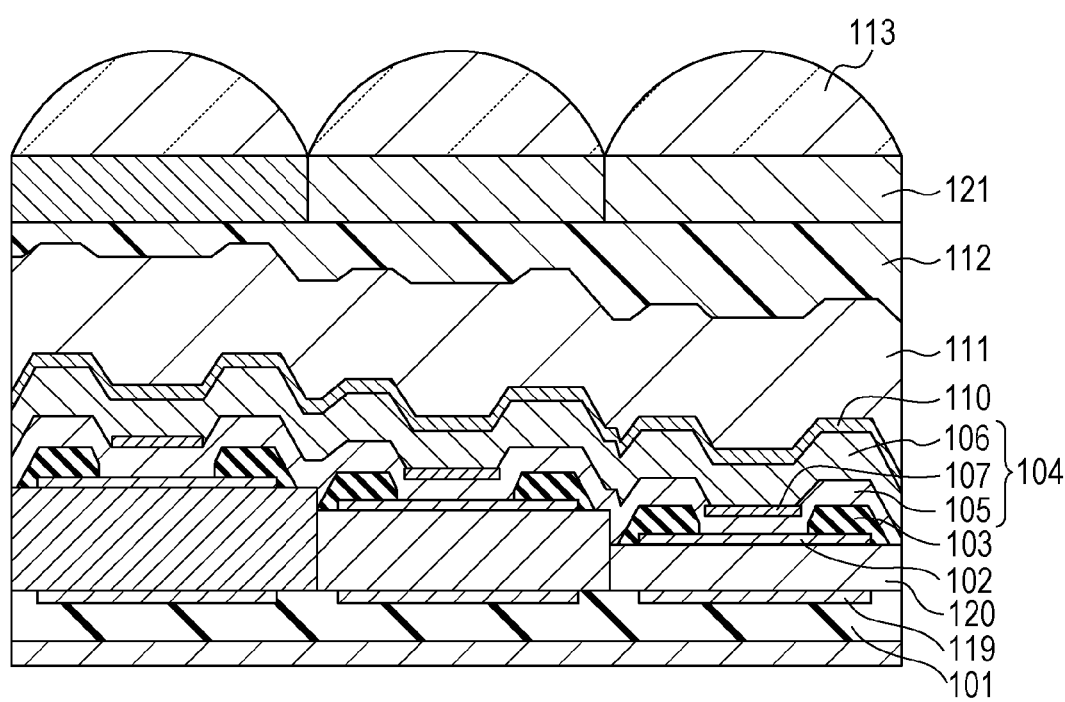
FIG. 4 is a schematic sectional view illustrating an example of an organic light-emitting device according to an embodiment of the present invention in which an optical resonator structure using a light-reflecting layer, a transparent insulating layer, and a color filter is formed.

FIG. 4 is a schematic sectional view of an organic light-emitting device according to this embodiment. The organic light-emitting device according to this embodiment is different from that of the first embodiment in that an organic light-emitting element includes, between the lower electrode and the insulating layer, a light-reflecting electrode 119 and a transparent insulating layer 120 and includes a color filter 121. In FIG. 4, the reference signs are described only for the rightmost organic light-emitting element; however, it is appreciated that the same configuration also applies to the leftmost and central organic light-emitting elements.

In FIG. 4, of the three organic light-emitting elements, the rightmost element, the first organic light-emitting element includes, between the first lower electrode and the insulating layer, a first light-reflecting layer and a first transparent insulating layer. The rightmost first organic light-emitting element also includes, over the protective layer, a first color filter that transmits light of a first emission wavelength. In FIG. 4, of the three organic light-emitting elements, the central element, the second organic light-emitting element includes, between the second lower electrode and the insulating layer, a second light-reflecting layer and a second transparent insulating layer. The second organic light-emitting element also includes, over the protective layer, a second color filter that transmits light of a second emission wavelength. In FIG. 4, of the three organic light-emitting elements, the leftmost element, the third organic light-emitting element includes, between the third lower electrode and the insulating layer, a third light-reflecting layer and a third transparent insulating layer. The third organic light-emitting element also includes, over the protective layer, a third color filter that transmits light of a third emission wavelength.

The first transparent insulating layer and the second transparent insulating layer are different in thickness. The first transparent insulating layer and the third transparent insulating layer are different in thickness. The second transparent insulating layer and the third transparent insulating layer are different in thickness.

More specifically, the first transparent insulating layer has a thickness that provides an interference structure causing constructive interference of, in the emission from the first organic light-emitting element, the first emission wavelength. In other words, the optical length between the first light-emitting layer or the second light-emitting layer and the first light-reflecting electrode is an optical length that causes constructive interference of the first emission wavelength. Similarly, the second transparent insulating layer has a thickness that provides an interference structure causing constructive interference of, in the emission from the second organic light-emitting element, the second emission wavelength. In other words, the optical length between the first light-emitting layer or the second light-emitting layer and the second light-reflecting layer is an optical length that causes constructive interference of the second emission wavelength. The third transparent insulating layer has a thickness that provides an interference structure causing constructive interference of, in the emission from the third organic light-emitting element, the third emission wavelength. In other words, the optical length between the first light-emitting layer or the second light-emitting layer and the third light-reflecting layer is an optical length that causes constructive interference of the third emission wavelength.

FIG. 4 illustrates microlenses; however, this configuration is a non-limiting example. The microlenses are not necessarily disposed in other cases.

The organic light-emitting device according to this embodiment can provide, in addition to advantages of the first embodiment, constructive optical interference of light extracted through the color filters, to provide increased emission luminance.

Fifth Embodiment

Figure 5:
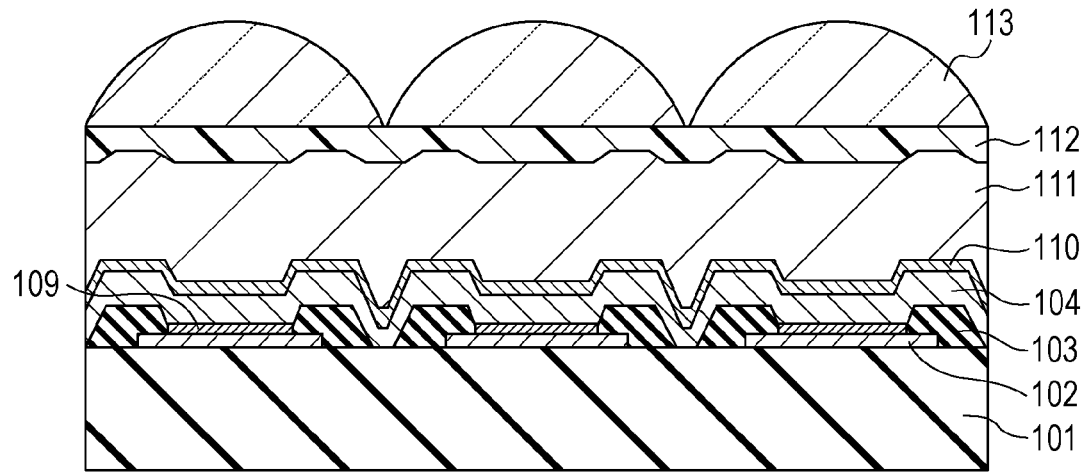
FIG. 5 is a schematic sectional view illustrating an example of an organic light-emitting device according to an embodiment of the present invention in which a first organic compound layer is in contact with a lower electrode.

FIG. 5 is a schematic sectional view of an organic light-emitting device according to this embodiment. The organic light-emitting device according to this embodiment is different from that of the first embodiment in that, of the first organic compound layer, only the third organic compound layer 109 is disposed in contact with the lower electrode. The third organic compound layer in this embodiment is not necessarily used in combination with the second organic compound layer, and hence is, unlike other embodiments, also referred to as a fourth organic compound layer 109. The organic compound layer 104 is, unlike other embodiments, also referred to as a fifth organic compound layer.

Thus, the organic light-emitting device according to this embodiment includes, on an insulating layer, a first lower electrode, an upper electrode, and an organic compound layer disposed between the first lower electrode and the upper electrode, wherein the organic compound layer includes a light-emitting layer, a fourth organic compound layer containing a compound having a lowest unoccupied molecular orbital level energy of −5.0 eV or less, and a fifth organic compound layer having a higher lowest unoccupied molecular orbital level energy than the fourth organic compound layer, and the orthogonal projection of the fourth organic compound layer onto the insulating layer is smaller than the orthogonal projection of the fifth organic compound layer onto the insulating layer. The fifth organic compound layer may include a plurality of organic compound layers. Of the fifth organic compound layer, a layer in contact with the fourth organic compound layer is a layer in which electrons are withdrawn by the fourth organic compound layer to induce holes. Of the fifth organic compound layer, a layer in contact with the fourth organic compound layer is formed of an organic compound having the highest occupied molecular orbital (HOMO) level energy that is different from the LUMO level energy of the compound contained in the fourth organic compound layer and having a LUMO of −5.0 eV or less, preferably by 1.0 eV or less, more preferably by 0.5 eV or less. The definition and measurement of the highest occupied molecular orbital are the same as those described above.

In FIG. 5, the reference signs are described only for the rightmost organic light-emitting element; however, it is appreciated that, for the other organic light-emitting elements, like elements are denoted by like reference signs. The first organic compound layer is not disposed between the first light-emitting layer and the second light-emitting layer, and hence the first light-emitting layer and the second light-emitting layer may be in contact with or separated from each other. Alternatively, the first light-emitting layer and the second light-emitting layer may be disposed so as to be collectively regarded as a single light-emitting layer. The first light-emitting layer and the second light-emitting layer are collectively regarded as a single light-emitting layer when the first light-emitting layer and the second light-emitting layer are disposed in contact with each other, are formed of the same constituent components, and are not distinguishable from each other.

In this embodiment, the first to third organic light-emitting elements may individually emit rays that are different from each other in wavelengths. Alternatively, the first to third organic light-emitting elements may all emit white light and divided into rays by being passed through color filters (not shown).

In the organic light-emitting device according to this embodiment, the first organic compound layer is disposed in contact with the lower electrodes and as a pixelation layer, to thereby reduce leakage current to the adjacent pixels or subsidiary pixels, to reduce unintended emission.

Sixth Embodiment

Figure 6:
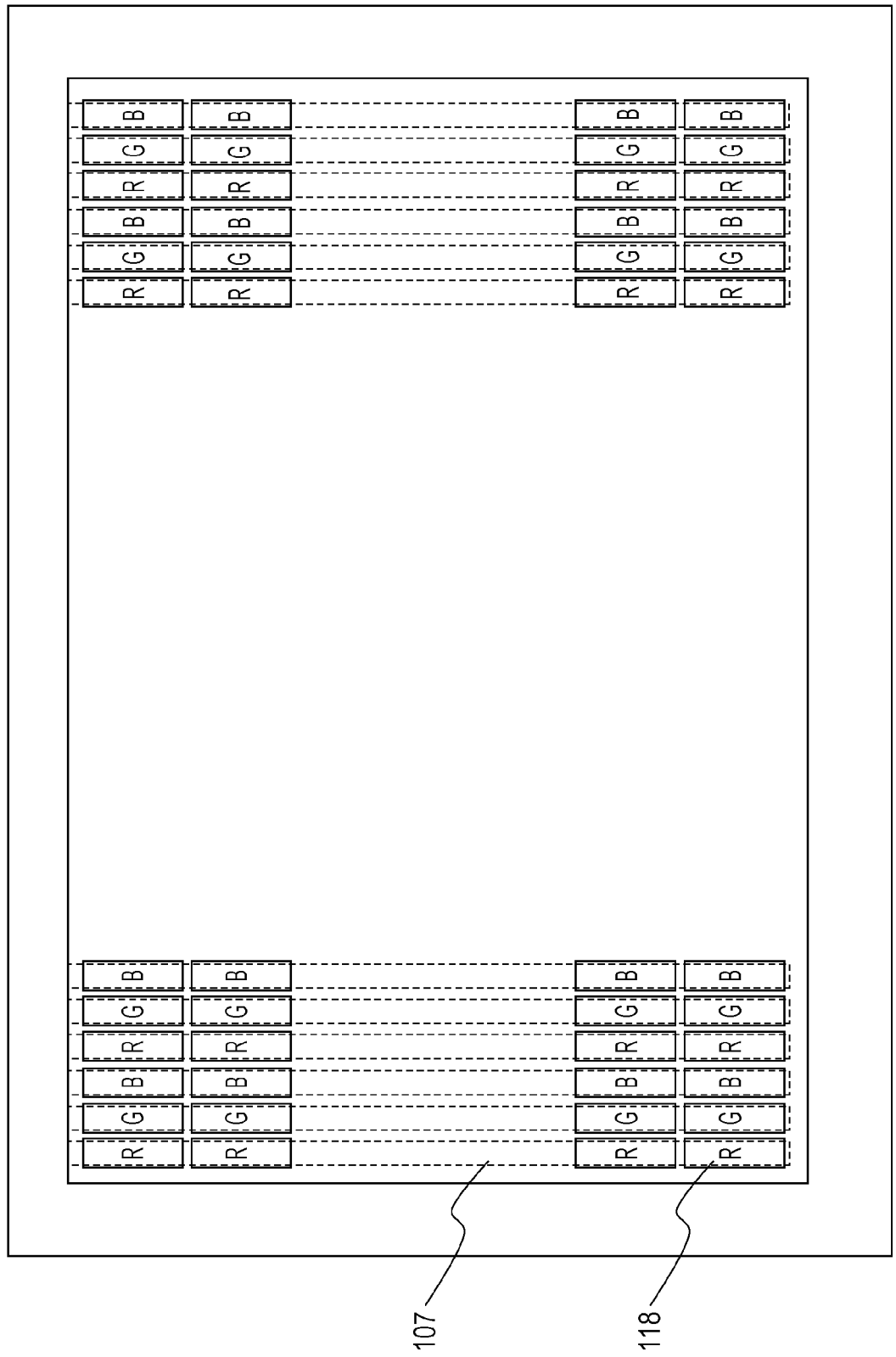
FIG. 6 is a plan view illustrating an example of an organic light-emitting device according to an embodiment of the present invention.
Figure 7:
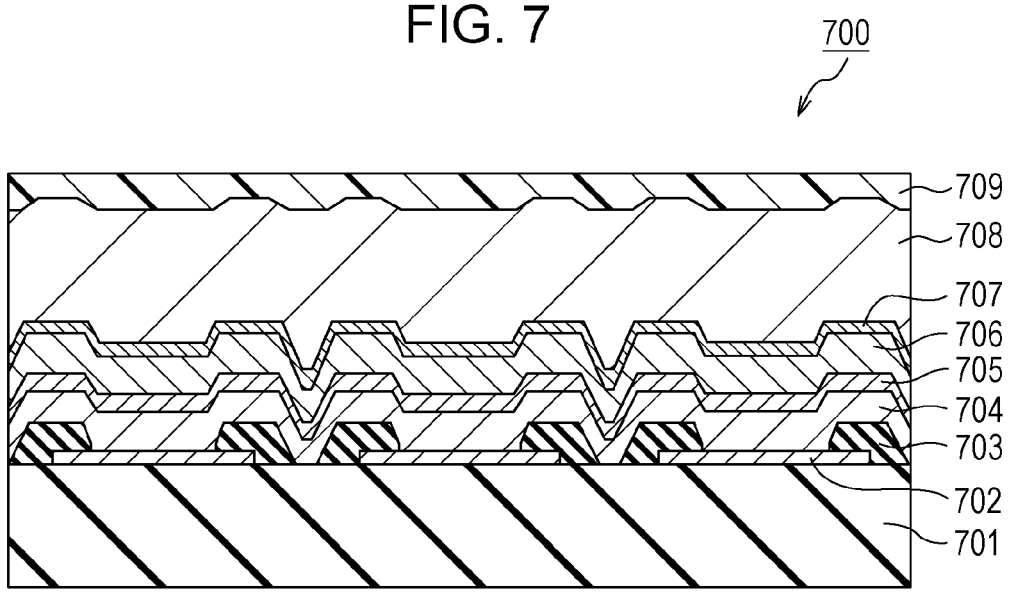
FIG. 7 is a schematic sectional view illustrating an example of an existing organic light-emitting device including a charge generation layer.

FIG. 6 is a schematic plan view of an organic light-emitting device according to this embodiment. The organic light-emitting device includes organic light-emitting elements 118. The organic light-emitting elements 118 are individually marked with R, G, or B, which represent the emission colors of the organic light-emitting elements. R, G, and B respectively stand for red, green, and blue. Specifically, the organic light-emitting element marked with R indicates that the organic light-emitting element emits red light. The same applies to the other colors. For the organic light-emitting elements of the different colors, the light-emitting layers may emit rays of the different colors, or light may be divided into rays by being passed through color filters. Even when the R, G, and B light-emitting layers individually have different configurations, the other organic compound layers may have the same configurations.

The first organic compound layers 107 may be layers that are not shared by, of the plurality of organic light-emitting elements, organic light-emitting elements configured to emit rays of different colors, what are called, pixelation layers. In the case of forming such a first organic compound layer that is not shared by a plurality of organic light-emitting elements, as illustrated in FIG. 6, the first organic compound layer of organic light-emitting elements configured to emit rays of the same color is formed so as to continuously extend. On the other hand, the first organic compound layers of organic light-emitting elements configured to emit rays of different colors are formed so as not to be connected together. In this embodiment, in the case of forming the first organic compound layers as pixelation layers, the third organic compound layers may be formed as pixelation layers to thereby achieve pixelation of the first organic compound layers.

The organic light-emitting device according to this embodiment can be produced using a vapor deposition mask. In the organic light-emitting device according to this embodiment, the pixelation regions are minimized, to thereby reduce the opening ratio of the vapor deposition mask, to provide the vapor deposition mask having high strength. In the organic light-emitting device according to this embodiment, the first organic compound layers are not shared, to thereby reduce leakage current to the adjacent pixels or subsidiary pixels, to reduce unintended emission.

For the embodiments having been described so far, features of the embodiments may be combined.

Configuration of Organic Light-Emitting Element

The organic light-emitting element is provided by forming, on a substrate, an insulating layer, a first electrode, an organic compound layer, and a second electrode. Over the cathode, for example, a protective layer, a color filter, or a microlens may be disposed. In the case of forming the color filter, a planarization layer may be formed between the protective layer and the color filter. The planarization layer may be formed of acrylic resin, for example. The same applies to a case of forming a planarization layer between the color filter and the microlens.

Substrate

The substrate may be a quartz substrate, a glass substrate, a silicon wafer, a resin substrate, or a metal substrate, for example. On the substrate, a switching element such as a transistor or wiring may be disposed, which may be overlain by an insulating layer. The insulating layer may be formed of any material as long as a contact hole can be formed so as to allow formation of wiring to the first electrode and insulation from unconnected wiring is ensured. Examples of the material include resins such as polyimide, silicon oxide, and silicon nitride.

Electrodes

As the electrodes, a pair of electrodes can be used. The pair of electrodes may be an anode and a cathode. In the case of applying an electric field in the emission direction of the organic light-emitting element, the electrode at the higher potential is the anode, and the other electrode is the cathode. In other words, the electrode configured to supply holes to the light-emitting layer is the anode, and the electrode configured to supply electrons is the cathode.

The material forming the anode can be a material having a work function as high as possible. Examples include elemental metals such as gold, platinum, silver, copper, nickel, palladium, cobalt, selenium, vanadium, and tungsten, mixtures containing the foregoing, alloys of combinations of the foregoing, and metal oxides such as tin oxide, zinc oxide, indium oxide, indium tin oxide (ITO), and indium zinc oxide. Other examples include conductive polymers such as polyaniline, polypyrrole, and polythiophene.

Such electrode substances may be used alone or in combination of two or more thereof. The anode may have a monolayer structure or a multilayer structure.

In the case of forming a reflective electrode, it may be formed of, for example, chromium, aluminum, silver, titanium, tungsten, molybdenum, an alloy of the foregoing, or a multilayer of the foregoing. Such a material may be used to form a light-reflecting layer that does not have the function of an electrode. In the case of forming a transparent electrode, non-limiting examples of it include a transparent conductive layer of an oxide such as indium tin oxide (ITO) or indium zinc oxide. The electrode can be formed by photolithography.

On the other hand, the material forming the cathode can be a material having a low work function. Examples of the material include alkali metals such as lithium, alkaline-earth metals such as calcium, elemental metals such as aluminum, titanium, manganese, silver, lead, and chromium, and mixtures of the foregoing. Other examples include alloys of combinations of these elemental metals, such as magnesium-silver, aluminum-lithium, aluminum-magnesium, silver-copper, and zinc-silver. Other examples include metal oxides such as indium tin oxide (ITO). Such electrode substances may be used alone or in combination of two or more thereof. The cathode may have a monolayer configuration or a multilayer configuration. In particular, silver can be used; in order to reduce aggregation of silver, silver alloys can be used. As long as aggregation of silver is reduced, the alloy ratio is not limited. For example, the ratio of silver:other metal may be 1:1 or 3:1.

The cathode is not particularly limited, may be formed as a conductive layer of an oxide such as ITO to provide a top emission element, or may be formed as a reflective electrode of, for example, aluminum (Al) to provide a bottom emission element. The method of forming the cathode is not particularly limited; for example, a direct-current or alternating-current sputtering method can be used because a high film coverage is achieved and the resistance tends to decrease.

Organic Compound Layer

The organic compound layer may have a monolayer structure or a multilayer structure. In the case of the multilayer structure, depending on the function, the layer may be referred to as a hole injection layer, a hole transport layer, an electron blocking layer, a light-emitting layer, a hole blocking layer, an electron transport layer, or an electron injection layer. The organic compound layer is mainly formed of an organic compound and may contain inorganic atoms or an inorganic compound. For example, the organic compound layer may contain copper, lithium, magnesium, aluminum, iridium, platinum, molybdenum, or zinc, for example. The organic compound layer may be disposed between the first electrode and the second electrode, and may be disposed in contact with the first electrode and the second electrode.

Protective Layer

Over the cathode, a protective layer may be disposed. For example, onto the cathode, a glass having a desiccant can be bonded, to reduce entry of, for example, water into the organic compound layer, to reduce occurrence of displaying failure. In another embodiment, over the cathode, a passivation film of, for example, silicon nitride may be disposed, to reduce entry of, for example, water into the organic compound layer. For example, the cathode formed in a vacuum may be transported, in the vacuum, to another chamber, and a CVD process may be performed to form a silicon nitride film having a thickness of 2 μm as a protective layer. After the film formation by the CVD process, an atomic layer deposition process (ALD process) may be performed to form a protective layer. The material of the film in the ALD process is not limited and examples include silicon nitride, silicon oxide, and aluminum oxide. Over the film formed by the ALD process, a film of silicon nitride may be further formed by a CVD process. The film formed by the ALD process may have a smaller thickness than the film formed by the CVD process. Specifically, the film formed by the ALD process may have a thickness that is 50% or less or 10% or less of the thickness of the film formed by the CVD process.

Color Filter

Over the protective layer, a color filter may be disposed. For example, a color filter formed on another substrate in accordance with the size of the organic light-emitting element may be bonded to the substrate having the organic light-emitting element. Alternatively, over the above-described protective layer, a color filter may be formed by patterning using photolithography. The color filter may be formed of a polymer.

Planarization Layer

Between the color filter and the protective layer, a planarization layer may be disposed. The planarization layer is disposed for the purpose of reducing the irregularities of the underlying layer. In order not to limit the purpose, the planarization layer may also be referred to as a material resin layer. The planarization layer may be formed of a low- or high-molecular-weight organic compound, and can be formed of a high-molecular-weight organic compound.

Such planarization layers may be disposed over and under the color filter, and may be the same or different in constituent material. Specific examples of the material include polyvinylcarbazole resin, polycarbonate resin, polyester resin, ABS resin, acrylic resin, polyimide resin, phenol resin, epoxy resin, silicone resin, and urea resin.

Microlens

The organic light-emitting device may include, on its emission side, an optical member such as a microlens. The microlens may be formed of acrylic resin or epoxy resin, for example. The microlens may be used for the purpose of increasing the amount of light extracted from the organic light-emitting device and controlling the direction of the extracted light. The microlens may have a hemispheric shape. When the microlens has a hemispheric shape, of the tangents touching the hemisphere, a tangent extends parallel to the insulating layer, and the point of contact of the tangent and the hemisphere is the uppermost point of the microlens. The uppermost point of the microlens can also be similarly determined in any sectional view. Specifically, in a sectional view, of the tangents touching the semicircle of the microlens, a tangent extends parallel to the insulating layer, and the point of contact of the tangent and the semicircle is the uppermost point of the microlens.

The midpoint of the microlens can also be defined. In a section of microlenses, a line segment extending from the end point of an arc shape to the end point of another arc shape is imagined, and the midpoint of the line segment can be referred to as the midpoint of the microlens. The sections used for determining the uppermost point and the midpoint may be sections perpendicular to the insulating layer.

Opposite Substrate

Over the planarization layer, an opposite substrate may be disposed. The opposite substrate is disposed at a position opposite the above-described substrate, and hence is referred to as an opposite substrate. The material forming the opposite substrate may be the same as in the above-described substrate. When the above-described substrate is referred to as a first substrate, the opposite substrate may be referred to as a second substrate.

Organic Layer

An organic compound layer (a hole injection layer, a hole transport layer, an electron blocking layer, a light-emitting layer, a hole blocking layer, an electron transport layer, or an electron injection layer, for example) of the organic light-emitting element according to an embodiment of the present invention is formed in the following manner.

The organic compound layer of the organic light-emitting element according to an embodiment of the present invention may be formed by a dry process such as a vacuum evaporation process, an ion plating process, sputtering, or a plasma process. Instead of the dry process, a wet process of dissolving the material in an appropriate solvent and forming a layer by a publicly known application process (such as spin-coating, dipping, a casting process, a LB process, or an ink jet process) may be performed.

In such a case of performing, for example, the vacuum evaporation process or the solution application process to form the layer, the layer is less likely to undergo, for example, crystallization and has high stability over time. In the case of performing the application process to form the film, the solution may be combined with an appropriate binder resin to form the film.

Non-limiting examples of the binder resin include polyvinylcarbazole resin, polycarbonate resin, polyester resin, ABS resin, acrylic resin, polyimide resin, phenol resin, epoxy resin, silicone resin, and urea resin.

Such binder resins may be used alone as a homopolymer or a copolymer or in combination of two or more thereof. In addition, as needed, publicly known additives such as a plasticizer, an antioxidant, or an ultraviolet absorbent may be used.

Pixel Circuit

The organic light-emitting device may include a pixel circuit connected to an organic light-emitting element. The pixel circuit may be an active-matrix circuit configured to control independently emission of each of the first light-emitting element and the second light-emitting element. The active-matrix circuit may be a voltage programming circuit or a current programming circuit. Such pixel circuits may be disposed in a one-to-one relationship for organic light-emitting elements. Such a pixel circuit may include a light-emitting element, a transistor configured to control the emission luminance of the light-emitting element, a transistor configured to control the emission timing, a capacitor configured to keep the gate voltage of the transistor configured to control the emission luminance, and a transistor for connection, not via the light-emitting element, to GND.

Depending on the size of the light emission region, the magnitude of the driving current may be determined. Specifically, in the case of causing the first light-emitting element and the second light-emitting element to emit light at the same luminance, the value of the current passed through the first light-emitting element may be set smaller than the value of the current passed through the second light-emitting element. This is because the light emission region is small and a small current may be sufficient.

The pixel circuit receives image signals from a signal circuit disposed around the display area where a plurality of pixels are disposed, and causes the organic light-emitting device to display the desired image.

Pixels

The organic light-emitting device includes a plurality of pixels. The pixels include subsidiary pixels configured to individually emit rays of colors different from each other. The subsidiary pixels may individually have emission colors such as R, G, and B.

In such a pixel, a region also referred to as a pixel opening is configured to emit light. This region is the same as the first region. The pixel opening may have a size of 15 μm or less, or 5 μm or more. More specifically, examples of the size include 12 μm, 9.5 μm, 7.4 μm, and 6.4 μm.

The intervals of the subsidiary pixels may be 10 μm or less; specific examples include 8 μm, 7.4 μm, and 6.4 μm.

The pixels may have, in plan view, a publicly known arrangement form such as the stripe arrangement, the delta arrangement, the PenTile arrangement, or the Bayer arrangement. The plan-view shape of the subsidiary pixels may be any publicly known shape such as a quadrangular shape such a rectangular shape or a rhombic shape, or a hexagonal shape. It is appreciated that shapes that are not exactly rectangles, but are similar to rectangles are also regarded as rectangles. The shape of the subsidiary pixels and the pixel arrangement can be used in combination.

Application of Organic Light-Emitting Device According to an Embodiment of the Present Invention An organic light-emitting device according to an embodiment of the present invention can be used as a constituent member for a display apparatus or an illumination apparatus, and is also applicable to, for example, the exposure light source of an electrophotographic image-forming apparatus, the backlight of a liquid crystal display apparatus, or a light-emitting device in which a white light source is equipped with a color filter.

The display apparatus may be an image information processing apparatus including an image input section configured to input image information from, for example, an area CCD, a linear CCD, or a memory card, and an information processing section configured to process the inputted information, and configured to display the inputted image on a display unit.

An image pickup apparatus or an ink jet printer may have a display unit having a touch panel function. The operation type of this touch panel function is not particularly limited, and may be an infrared type, an electrostatic capacitance type, a resistive film type, or an electromagnetic induction type. The display apparatus may be used as a display unit of a multifunctional printer.

Hereinafter, a display apparatus according to this embodiment will be described with reference to a drawing.

Figure 8:
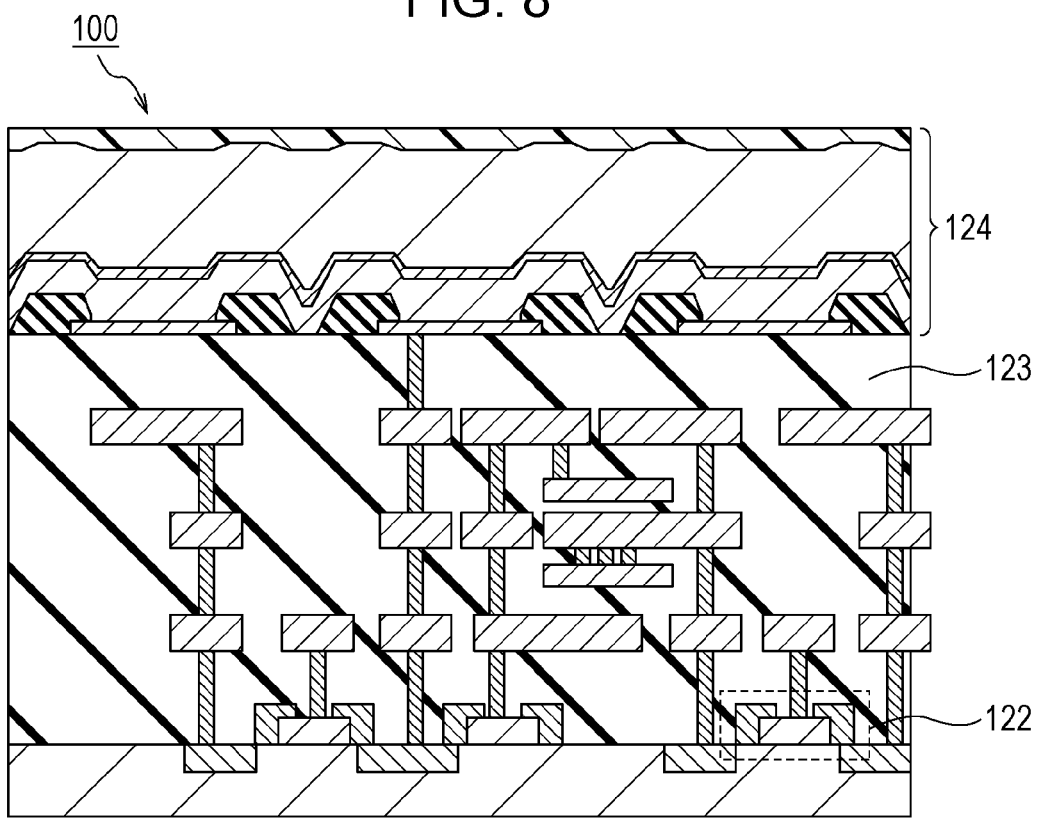
FIG. 8 is a schematic sectional view illustrating an example of a display apparatus according to an embodiment of the present invention.

FIG. 8 is a schematic sectional view illustrating an example of an organic light-emitting device including an organic light-emitting element and a transistor connected to the organic light-emitting element. The transistor is an example of an active element. The transistor is not limited to the configuration in FIG. 8, and may be a thin-film transistor (TFT).

In FIG. 8, the organic light-emitting device includes an organic light-emitting element 124 disposed above an interlayer insulation layer 123 and a transistor 122. FIG. 8 illustrates, in the organic light-emitting device, the organic compound layer like a single layer; however, the organic compound layer may include a plurality of layers. Over the cathode, a first protective layer for reducing deterioration of the organic light-emitting elements and a resin layer for achieving planarization of the upper surface are disposed.

In FIG. 8, the transistor used for the organic light-emitting device is not limited to a transistor using a single-crystal silicon wafer, and may use a compound semiconductor. The active layer may be formed of single-crystal silicon, a non-single-crystal silicon such as amorphous silicon or microcrystal silicon, or a non-single-crystal oxide semiconductor such as indium zinc oxide or indium gallium zinc oxide.

In FIG. 8, the transistor included in the organic light-emitting device may be formed within the substrate such as a Si substrate. The phrase "formed within the substrate" means that the substrate itself such as a Si substrate is processed to form the transistor. In other words, the configuration in which the transistor is included within the substrate can also be regarded as a configuration in which the substrate and the transistor are formed as a single unit.

The organic light-emitting element according to this embodiment is controlled, in terms of emission luminance, by a transistor as an example of the switching element. A plurality of such organic light-emitting elements are arranged in a plane, to emit light rays at individual emission luminances to thereby display images. The phrase "on the substrate" includes "within the substrate". Whether transistors are formed within the substrate or TFTs are used depends on the size of the display unit. For example, when the display unit has a size of about 0.5 inches, the organic light-emitting elements can be formed on a Si substrate.

Figure 9:
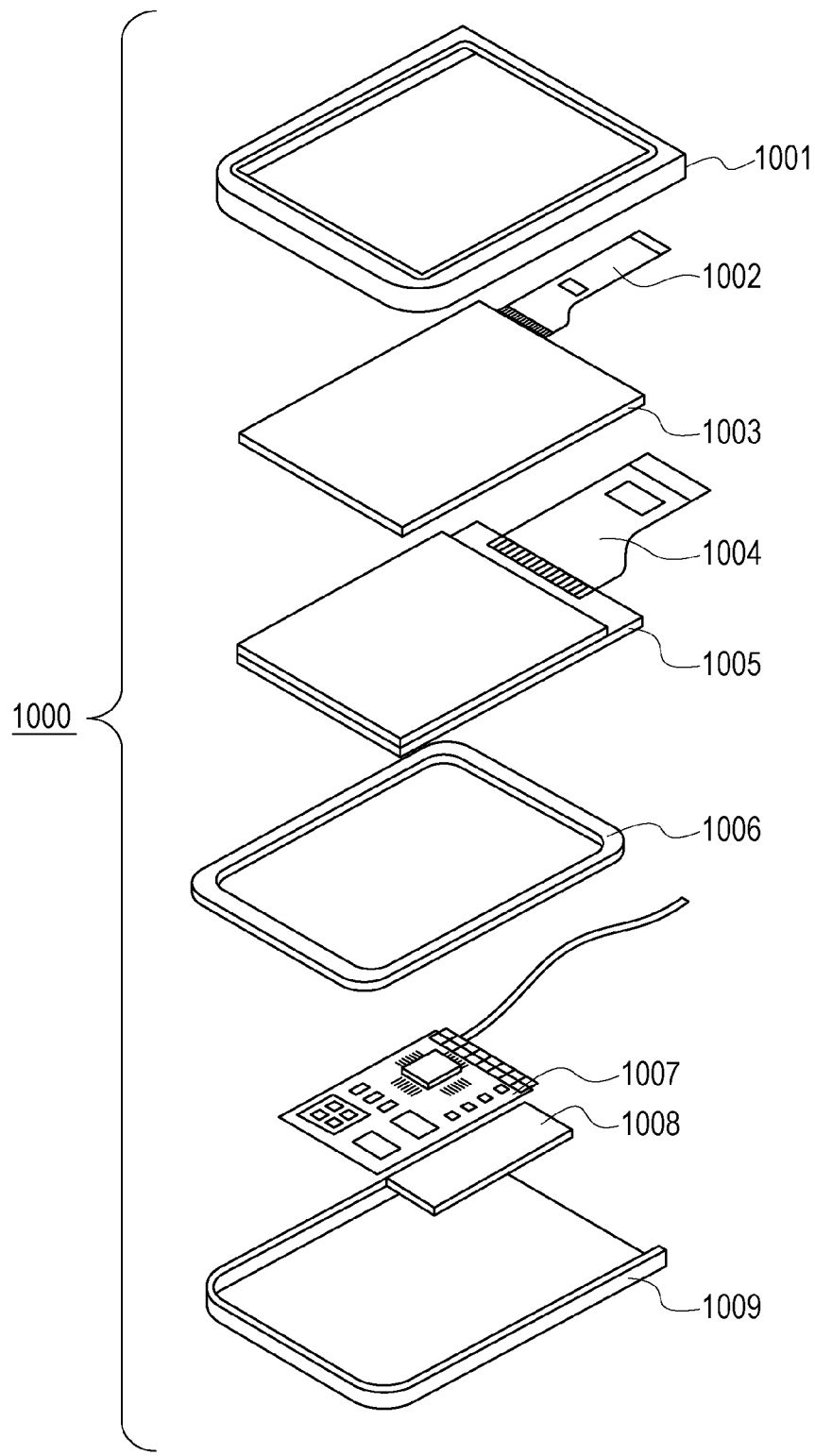
FIG. 9 is a schematic view illustrating an example of a display apparatus according to an embodiment of the present invention.

FIG. 9 is a schematic view illustrating an example of a display apparatus according to this embodiment. A display apparatus 1000 may include, between an upper cover 1001 and a lower cover 1009, a touch panel 1003, a display panel 1005, a frame 1006, a circuit substrate 1007, and a battery 1008. To the touch panel 1003 and the display panel 1005, flexible printed circuit FPCs 1002 and 1004 are respectively connected. On the circuit substrate 1007, transistors are formed by printing. The battery 1008 may not be installed when the display apparatus is not a mobile apparatus. When the display apparatus is a mobile apparatus, the battery 1008 may be installed in another position.

The display apparatus according to this embodiment may include red, green, and blue color filters. The red, green, and blue color filters may be arranged in the delta arrangement.

The display apparatus according to this embodiment may be used as a display unit of a mobile terminal. In this case, the display apparatus may have both of the displaying function and the operation function. Examples of the mobile terminal include mobile phones such as smartphones, tablets, and head-mounted displays.

A display apparatus according to this embodiment may be used as a display unit of an image pickup apparatus including an optical unit including a plurality of lenses and an image pickup element configured to receive light having passed through the optical unit. The image pickup apparatus may include a display unit configured to display information obtained by the image pickup element. The display unit may be a display unit exposed outside of the image pickup apparatus, or a display unit disposed within the finder. The image pickup apparatus may be a digital camera or a digital video camera.

Figure 10A:
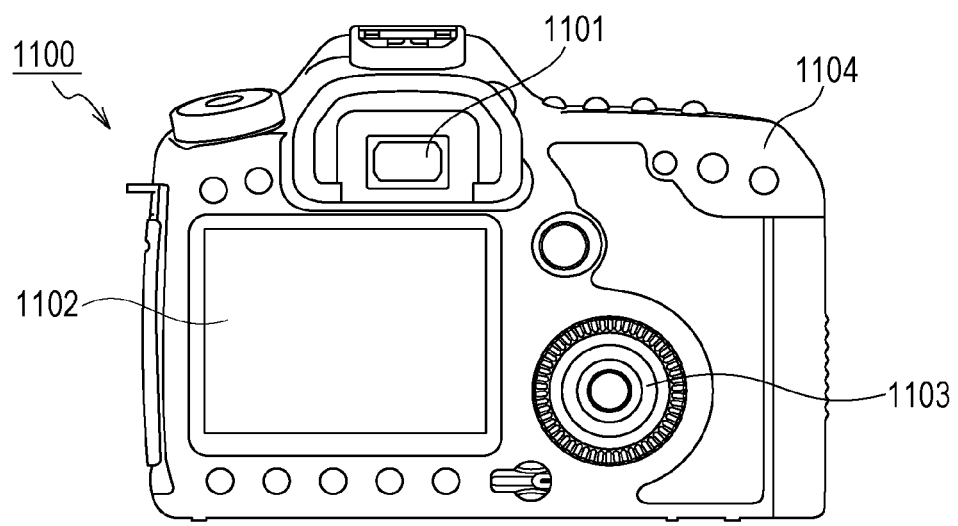
FIG. 10A is a schematic view illustrating an example of an image pickup apparatus according to an embodiment of the present invention.

FIG. 10A is a schematic view illustrating an example of an image pickup apparatus according to this embodiment. An image pickup apparatus 1100 may include a view finder 1101, a rear surface display 1102, an operation unit 1103, and a housing 1104. The view finder 1101 may include the display apparatus according to this embodiment. In this case, the display apparatus may display not only an image to be captured, but also, for example, environmental information and image capture instructions. Examples of the environmental information include the intensity of external light, the orientation of external light, the moving speed of the subject, and the probability that the subject may hide behind an obstacle.

Since the timing suitable for capturing an image lasts for a very short period, the information is desirably displayed with minimum delay. Thus, a display apparatus employing an organic light-emitting device according to an embodiment of the present invention can be used because the organic light-emitting device responds at a high speed. The display apparatus employing the organic light-emitting device can be more suitably used for such image pickup apparatuses required to display images at high speed than liquid crystal display apparatuses.

The image pickup apparatus 1100 includes an optical unit (not shown). The optical unit includes a plurality of lenses and is configured to form an image in the image pickup element contained within the housing 1104. The plurality of lenses can be adjusted in terms of relative positions, to thereby adjust the focus. This operation can also be performed automatically. The image pickup apparatus may also be referred to as a photoelectric conversion apparatus. The photoelectric conversion apparatus may include, instead of an image pickup mode of capturing images in succession, image pickup modes such as a mode of detecting the difference from the previous image and a mode of extracting images from continuously recorded images.

Figure 10B:
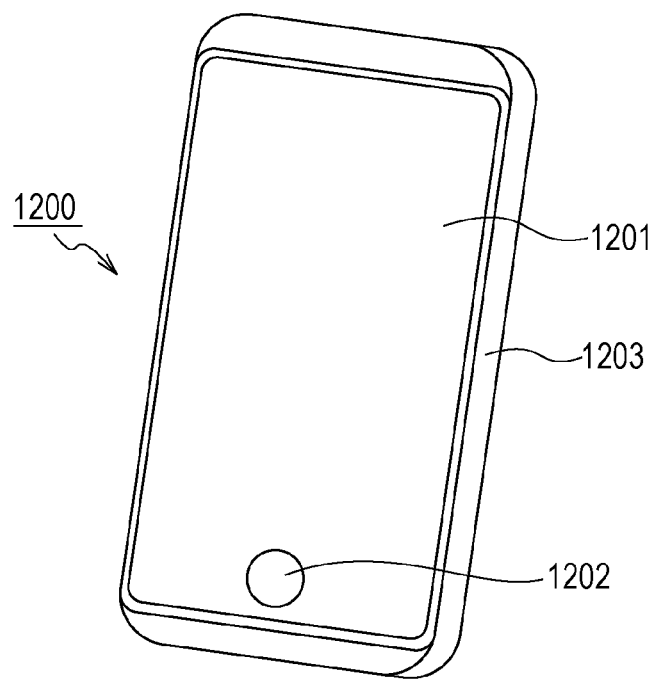
FIG. 10B is a schematic view illustrating an example of an electronic apparatus according to an embodiment of the present invention.

FIG. 10B is a schematic view illustrating an example of an electronic apparatus according to this embodiment. An electronic apparatus 1200 includes a display unit 1201, an operation unit 1202, and a housing 1203. The housing 1203 may include circuits, a printed substrate including the circuits, a battery, and a communication unit. The operation unit 1202 may be a button or a touch-panel-type sensor unit. The operation unit may be a biometric unit configured to scan a fingerprint for unlocking, for example. Such an electronic apparatus including a communication unit can also be referred to as a communication apparatus. The electronic apparatus may further include a lens and an image pickup element to thereby have a camera function. The images captured by the camera function are displayed on the display unit. Examples of the electronic apparatus include smartphones and notebook computers.

Figure 11A:
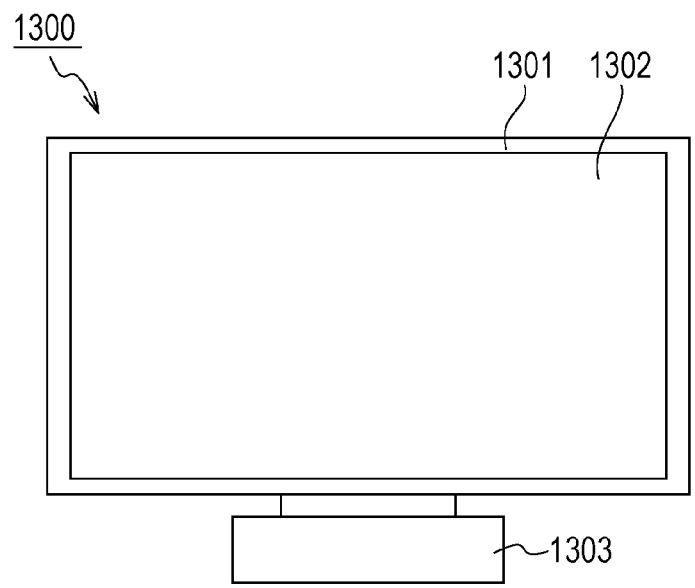
FIG. 11A is a schematic view illustrating an example of a display apparatus according to an embodiment of the present invention.

FIG. 11A is a schematic view illustrating an example of a display apparatus according to this embodiment. FIG. 11A illustrates a display apparatus such as a television monitor or a PC monitor. A display apparatus 1300 includes a frame 1301 and a display unit 1302. The display unit 1302 may employ the light-emitting device according to this embodiment.

The display apparatus includes a base 1303, which supports the frame 1301 and the display unit 1302. The base 1303 is not limited to the form illustrated in FIG. 11A. The lower side of the frame 1301 may also function as the base.

The frame 1301 and the display unit 1302 may be curved. The radius of the curvature may be 5000 mm or more and 6000 mm or less.

Figure 11B:
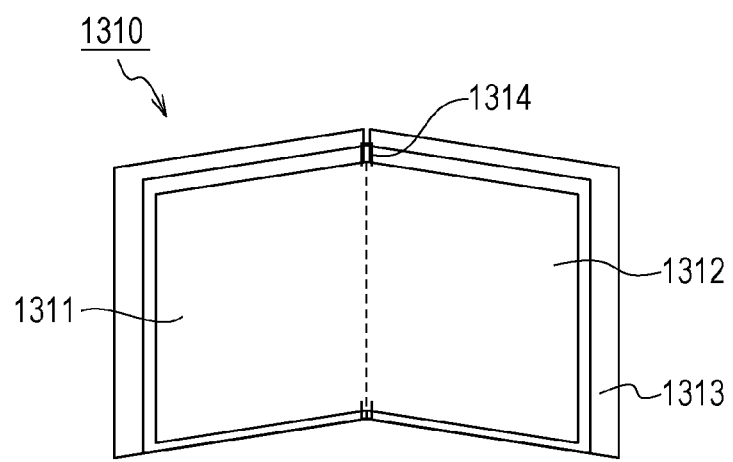
FIG. 11B is a schematic view illustrating an example of a foldable display apparatus.

FIG. 11B is a schematic view illustrating another example of the display apparatus according to this embodiment. A display apparatus 1310 in FIG. 11B can be folded, namely a foldable display apparatus. The display apparatus 1310 includes a first display unit 1311, a second display unit 1312, a housing 1313, and a folding point 1314. The first display unit 1311 and the second display unit 1312 may include the light-emitting device according to this embodiment. The first display unit 1311 and the second display unit 1312 may be collectively designed as a seamless single display apparatus. The first display unit 1311 and the second display unit 1312 can be sectioned with respect to the folding point. Specifically, the first display unit 1311 and the second display unit 1312 may individually display different images; and the first and second display units may collectively display a single image.

Figure 12A:
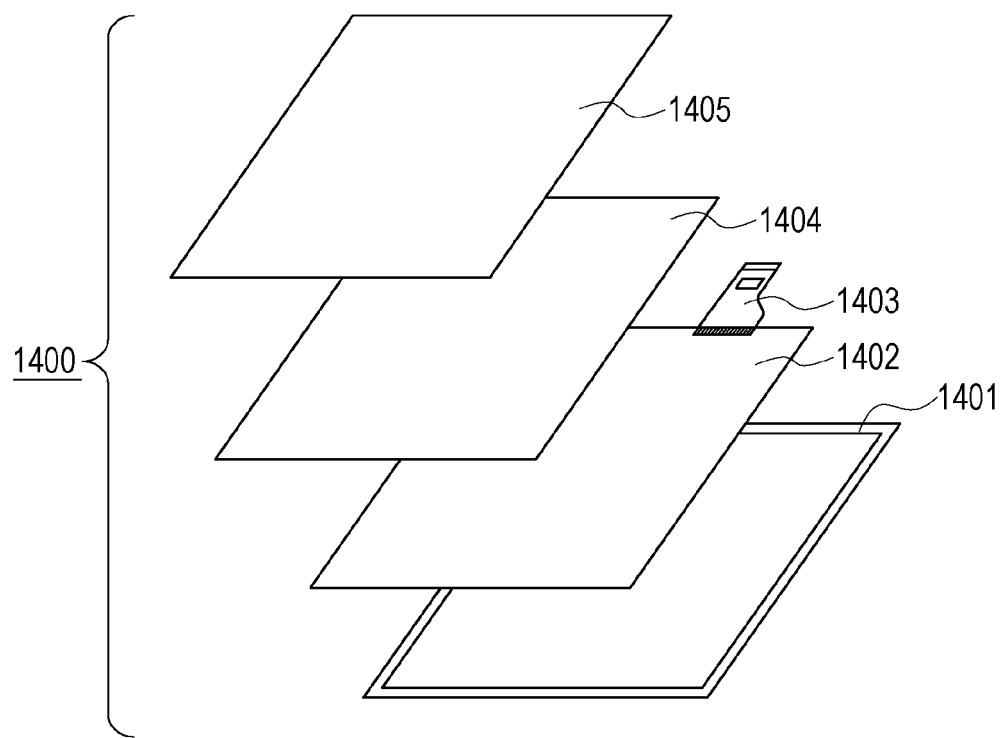
FIG. 12A is a schematic view illustrating an example of an illumination apparatus according to an embodiment of the present invention.

FIG. 12A is a schematic view illustrating an example of an illumination apparatus according to this embodiment. An illumination apparatus 1400 may include a housing 1401, a light source 1402, a circuit substrate 1403, an optical film 1404, and a light diffusion unit 1405. The light source may include the organic light-emitting device according to this embodiment. An optical filter may be provided to improve color rendering of the light source. The light diffusion unit is configured to effectively diffuse light from the light source to deliver the light to a wide area, such as lighting up. The optical filter and the light diffusion unit may be provided on the light exit side of the illumination. The illumination may be optionally equipped with a cover for the outermost portion thereof.

The illumination apparatus is, for example, an apparatus configured to illuminate the inside of a room. The illumination apparatus may be configured to emit light of any color of white, neutral white, and colors from blue to red. The illumination apparatus may include a light modulation circuit for modulating the light. The illumination apparatus may include an organic light-emitting device according to an embodiment of the present invention and a power supply circuit connected to the organic light-emitting device. The power supply circuit is configured to convert alternating current voltage to direct current voltage. The "white" corresponds to a color temperature of 4200 K. The "neutral white" corresponds to a color temperature of 5000 K. The illumination apparatus may include a color filter.

The illumination apparatus according to this embodiment may include a heat dissipation unit. The heat dissipation unit is configured to release heat inside of the apparatus to the outside of the apparatus. The heat dissipation unit is formed of, for example, a metal having a high specific heat or liquid silicone.

Figure 12B:
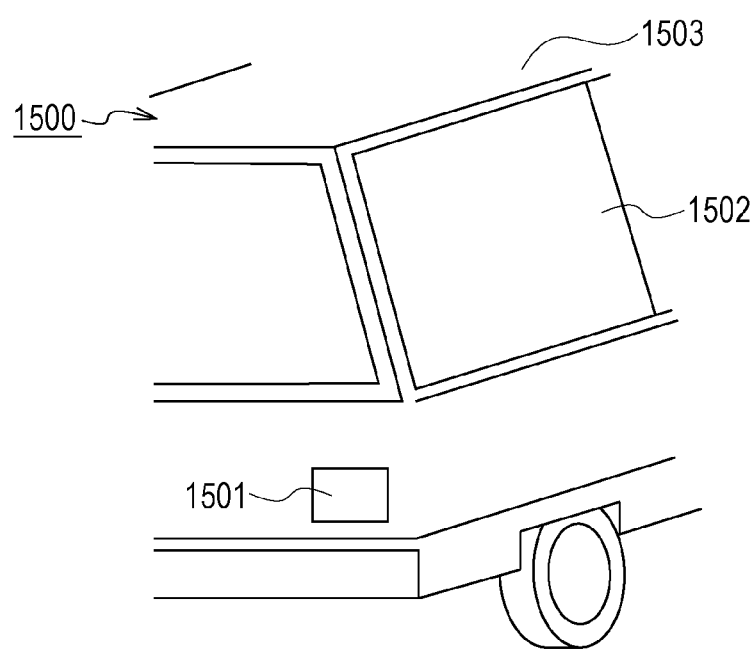
FIG. 12B is a schematic view illustrating an example of an automobile including a vehicle illumination unit according to an embodiment of the present invention.

FIG. 12B is a schematic view of an automobile serving as an example of a moving object according to this embodiment. The automobile includes a tail lamp serving as an example of the illumination unit. An automobile 1500 includes a tail lamp 1501 that may be configured to turn on upon braking, for example.

The tail lamp 1501 may include the organic light-emitting device according to this embodiment. The tail lamp may include a protective member for protecting the organic EL element. The protective member is not limited in terms of material as long as it has relatively high strength and is transparent. The protective member can be formed of polycarbonate, for example. The polycarbonate may be mixed with, for example, a furandicarboxylic acid derivative or an acrylonitrile derivative.

The automobile 1500 may include an automobile body 1503 and a window 1502 attached to the automobile body 1503. When the window is not windows for checking ahead or behind of the automobile, it may be designed as a transparent display. This transparent display may include the organic light-emitting device according to this embodiment. In this case, constituent members of the organic light-emitting device, such as electrodes, are provided as transparent members.

The moving object according to this embodiment may be a ship, an aircraft, or a drone, for example. The moving object may include a body and an illumination unit provided to the body. The illumination unit may emit light in order to indicate the position of the body. The illumination unit includes the organic light-emitting device according to this embodiment.

Figure 13A:
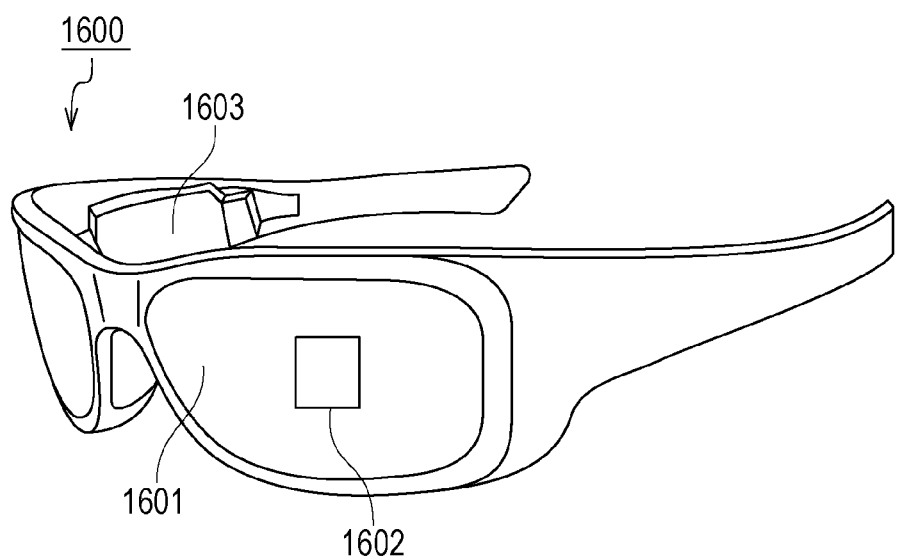
FIG. 13A is a schematic view illustrating an example of a wearable device according to an embodiment of the present invention.

FIG. 13A illustrates an example of a wearable device including an organic light-emitting device according to this embodiment. The organic light-emitting device is applicable to systems that are wearable devices such as smart glasses, HMDs, and smart contact lenses. The image pickup display apparatus used in such application examples includes an image pickup apparatus configured to perform photoelectric conversion of visible light, and a display apparatus configured to emit visible light.

FIG. 13A illustrates glasses 1600 (smart glasses) serving as an application example. In the glasses 1600, on the front side of a lens 1601, an image pickup apparatus 1602 such as a CMOS sensor or a SPAD is disposed. In addition, on the backside of the lens 1601, the display apparatus according to any one of the above-described embodiments is disposed.

The glasses 1600 further include a controller 1603. The controller 1603 functions as a power supply configured to supply electric power to the image pickup apparatus 1602 and the display apparatus according to any one of the embodiments. The controller 1603 is configured to control operations of the image pickup apparatus 1602 and the display apparatus. In the lens 1601, an optical system configured to focus light onto the image pickup apparatus 1602 is formed.

Figure 13B:
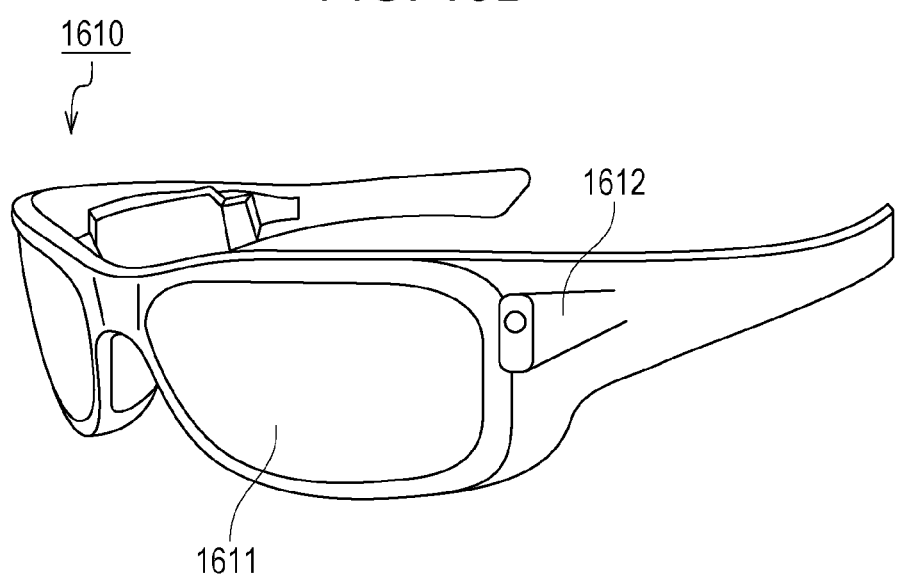
FIG. 13B is a schematic view illustrating an example of a wearable device according to an embodiment of the present invention including an image pickup apparatus.

FIG. 13B illustrates glasses 1610 (smart glasses) serving as an application example. The glasses 1610 include a controller 1612. On the controller 1612, an image pickup apparatus corresponding to the image pickup apparatus 1602 and a display apparatus are mounted. In a lens 1611, an optical system configured to project light from the image pickup apparatus within the controller 1612 and the display apparatus is formed, and images are projected onto the lens 1611. The controller 1612 functions as a power supply configured to supply electric power to the image pickup apparatus and the display apparatus and controls operations of the image pickup apparatus and the display apparatus. The controller may include a gaze detection unit configured to detect the gaze of the wearer. The gaze may be detected using infrared radiation. An infrared-emitting unit emits infrared light to the eye of the user gazing the displayed image. The infrared light emitted is reflected by the eyeball, and the reflected light is detected by an image pickup unit including a light-receiving element to provide the captured image of the eyeball. A reduction unit is configured to reduce light from the infrared-emitting unit to the display unit in plan view, to reduce deterioration of image quality.

From the captured image of the eyeball obtained by capturing the infrared light, the user's gaze to the displayed image is detected. To the gaze detection using the captured image of the eyeball, a publicly known method is appropriately applicable. For example, the gaze detection method based on the Purkinje image due to reflection of irradiation light at the cornea is usable.

More specifically, the pupil center corneal reflection technique is used to perform gaze detection processing. The pupil center corneal reflection technique is used, on the basis of the pupil image and the Purkinje image included in the captured image of the eyeball, to calculate the gaze vector representing the orientation of the eyeball (rotation angle), to thereby detect the user's gaze.

A display apparatus according to an embodiment of the present invention includes an image pickup apparatus including a light-receiving element, and may control, on the basis of the user's gaze data from the image pickup apparatus, the displayed image of the display apparatus.

Specifically, the display apparatus determines, on the basis of the gaze data, a first viewing region that the user gazes, and a second viewing region other than the first viewing region. The first viewing region and the second viewing region may be determined by the controller of the display apparatus, or on the basis of the determination result received from an outer controller. In the display area of the display apparatus, the display resolution of the first viewing region may be controlled to be higher than the display resolution of the second viewing region. In other words, the resolution of the second viewing region may be controlled to be lower than that of the first viewing region.

The display area includes a first display area and a second display area different from the first display area; on the basis of the gaze data, from the first display area and the second display area, the area of a higher priority is determined. The first display area and the second display area may be determined by the controller of the display apparatus, or on the basis of the determination result received from an outer controller. The resolution of the area of a higher priority may be controlled to be higher than the resolution of the area other than the area of a higher priority. In other words, the resolution of the area of a lower priority may be controlled to be lower.

Note that the first viewing region or the area of a higher priority may be determined using AI. AI may be a model configured to, on the basis of supervised data of images of eyeballs and the actual gaze directions of the eyeballs in the images, estimate the angle of the gaze direction and the distance to the target of the gaze from images of eyeballs. The AI program may be stored in the display apparatus, in the image pickup apparatus, or in an outer apparatus. When the AI program is stored in the outer apparatus, it is transmitted via communication to the display apparatus.

In the case of controlling displaying on the basis of visual recognition detection, smart glasses further including an image pickup apparatus configured to capture the external images can be applied. The smart glasses are configured to display captured external data in real time.

As has been described so far, apparatuses employing the organic light-emitting device according to this embodiment enable displaying of images with high quality for a long time with stability.

The present invention provides an organic light-emitting device in which the regions of generating charges are reduced, to thereby reduce unintended emission.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-176075, filed Oct. 20, 2020, which is hereby incorporated by reference herein in its entirety.

What is claimed is:

1. An organic light-emitting device comprising, on an insulating layer, a first lower electrode, an upper electrode, and an organic compound layer disposed between the first lower electrode and the upper electrode,
wherein the organic compound layer includes a first light-emitting layer, a second light-emitting layer disposed between the first light-emitting layer and the upper electrode, and a first organic compound layer disposed between the first light-emitting layer and the second light-emitting layer,
the first organic compound layer includes a second organic compound layer containing an alkali metal, and a third organic compound layer disposed between the second organic compound layer and the upper electrode and containing a compound having a lowest unoccupied molecular orbital level energy of −5.0 eV or less, and
an orthogonal projection of an entirety of the first organic compound layer onto the insulating layer is smaller than an orthogonal projection of an entirety of the first light-emitting layer onto the insulating layer.

2. The organic light-emitting device according to claim 1, further comprising a second lower electrode disposed between the insulating layer and the organic compound layer,
wherein the orthogonal projection of the first light-emitting layer onto the insulating layer overlaps an orthogonal projection of the second lower electrode onto the insulating layer, and
the orthogonal projection of the first organic compound layer onto the insulating layer does not overlap the orthogonal projection of the second lower electrode onto the insulating layer.

3. The organic light-emitting device according to claim 1, further comprising a pixel isolation layer covering an edge of the first lower electrode, wherein the first lower electrode includes a first region in contact with the organic compound layer and a second region in contact with the pixel isolation layer, and
the orthogonal projection of the first organic compound layer onto the insulating layer is smaller than an orthogonal projection of the first region onto the insulating layer.

4. The organic light-emitting device according to claim 3, wherein an orthogonal projection of the third organic compound layer onto the insulating layer is smaller than the orthogonal projection of the first region onto the insulating layer.

5. The organic light-emitting device according to claim 1, further comprising an optical member on the upper electrode, wherein the orthogonal projection of the first organic compound layer onto the insulating layer is smaller than an orthogonal projection of the optical member onto the insulating layer.

6. The organic light-emitting device according to claim 5, further comprising a pixel isolation layer covering an edge of the first lower electrode, wherein the first lower electrode includes a first region in contact with the organic compound layer and a second region in contact with the pixel isolation layer, and
an orthogonal projection of the first region onto the insulating layer is smaller than the orthogonal projection of the optical member onto the insulating layer, and larger than the orthogonal projection of the first organic compound layer onto the insulating layer.

7. The organic light-emitting device according to claim 6, wherein the optical member is a lens, and
in a section perpendicular to the insulating layer, an uppermost point of the lens is positioned between, in a direction parallel to the insulating layer, a midpoint of the first region and a midpoint of the first organic compound layer.

8. The organic light-emitting device according to claim 1, further comprising a second lower electrode between the insulating layer and the organic compound layer, a first light-reflecting layer between the first lower electrode and the insulating layer, a first transparent insulating layer between the first light-reflecting layer and the first lower electrode,
a second light-reflecting layer between the second lower electrode and the insulating layer, and a second transparent insulating layer between the second light-reflecting layer and the second lower electrode,
the first transparent insulating layer having a thickness different from a thickness of the second transparent insulating layer.

9. The organic light-emitting device according to claim 8, further comprising a first color filter disposed on the first lower electrode and configured to transmit light of a first emission wavelength, and a second color filter disposed on the second lower electrode and configured to transmit light of a second emission wavelength, wherein an optical length between the first light-emitting layer and the first light-reflecting layer is an optical length that causes constructive interference of light of the first emission wavelength, and an optical length between the second light-emitting layer and the second light-reflecting layer is an optical length that causes constructive interference of light of the second emission wavelength.

10. The organic light-emitting device according to claim 1, further comprising a second lower electrode and a third lower electrode that are adjacent to the first lower electrode and between the first organic compound layer and the insulating layer,
a first color filter disposed on the first lower electrode and configured to transmit light of a first emission wavelength, a second color filter disposed on the second lower electrode and configured to transmit light of a second emission wavelength, and a third color filter disposed on the third lower electrode and configured to transmit light of a third emission wavelength, wherein the first organic compound layer whose orthogonal projection onto the insulating layer overlaps the first lower electrode is disposed so as to be connected to the first organic compound layer whose orthogonal projection onto the insulating layer overlaps the third lower electrode, and
the first organic compound layer whose orthogonal projection onto the insulating layer overlaps the second lower electrode is not connected to the first organic compound layer whose orthogonal projection onto the insulating layer overlaps the first lower electrode.

11. The organic light-emitting device according to claim 1, wherein a size of each orthogonal projection onto the insulating layer is a length of the corresponding orthogonal projection onto the insulating layer in a section perpendicular to the insulating layer.

12. An organic light-emitting device comprising, on an insulating layer, a first lower electrode, an upper electrode, and an organic compound layer disposed between the first lower electrode and the upper electrode,
wherein the organic compound layer includes a light-emitting layer, a fourth organic compound layer containing a compound having a lowest unoccupied molecular orbital level energy of −5.0 eV or less, and a fifth organic compound layer having a higher lowest unoccupied molecular orbital level energy than the fourth organic compound layer, and
an orthogonal projection of an entirety of the fourth organic compound layer onto the insulating layer is smaller than an orthogonal projection of an entirety of the fifth organic compound layer onto the insulating layer.

13. The organic light-emitting device according to claim 12, further comprising a second lower electrode between the insulating layer and the organic compound layer, wherein the orthogonal projection of the fifth organic compound layer onto the insulating layer overlaps an orthogonal projection of the second lower electrode onto the insulating layer, and
the orthogonal projection of the fourth organic compound layer onto the insulating layer does not overlap the orthogonal projection of the second lower electrode onto the insulating layer.

14. The organic light-emitting device according to claim 12, further comprising a second lower electrode between the insulating layer and the organic compound layer, wherein the fifth organic compound layer whose orthogonal projection onto the insulating layer overlaps the first lower electrode is disposed so as to be connected to the fifth organic compound layer whose orthogonal projection onto the insulating layer overlaps the second lower electrode, and
the fourth organic compound layer whose orthogonal projection onto the insulating layer overlaps the first lower electrode is not connected to the fourth organic compound layer whose orthogonal projection onto the insulating layer overlaps the second lower electrode.

15. The organic light-emitting device according to claim 12, further comprising a pixel isolation layer covering an edge of the first lower electrode, wherein the first lower electrode includes a first region in contact with the organic compound layer and a second region in contact with the pixel isolation layer, and
the orthogonal projection of the fourth organic compound layer onto the insulating layer is smaller than an orthogonal projection of the first region onto the insulating layer.

16. The organic light-emitting device according to claim 12, further comprising an optical member on the upper electrode,
wherein the orthogonal projection of the fourth organic compound layer onto the insulating layer is smaller than an orthogonal projection of the optical member onto the insulating layer.

17. The organic light-emitting device according to claim 16, further comprising a pixel isolation layer covering an edge of the first lower electrode, wherein the first lower electrode includes a first region in contact with the organic compound layer and a second region in contact with the pixel isolation layer, and
an orthogonal projection of the first region onto the insulating layer is smaller than the orthogonal projection of the optical member onto the insulating layer, and is larger than the orthogonal projection of the fourth organic compound layer onto the insulating layer.

18. The organic light-emitting device according to claim 17, wherein the optical member is a lens,
in a section perpendicular to the insulating layer, an uppermost point of the lens is positioned between, in a direction parallel to the insulating layer, a midpoint of the first region and a midpoint of the fourth organic compound layer.

19. The organic light-emitting device according to claim 12, further comprising a second lower electrode between the insulating layer and the organic compound layer, a first light-reflecting layer between the first lower electrode and the insulating layer, a first transparent insulating layer between the first light-reflecting layer and the first lower electrode,
a second light-reflecting layer between the second lower electrode and the insulating layer, and a second transparent insulating layer between the second light-reflecting layer and the second lower electrode,
the first transparent insulating layer having a thickness different from a thickness of the second transparent insulating layer.

20. The organic light-emitting device according to claim 19, further comprising a first color filter disposed on the first lower electrode and configured to transmit light of a first emission wavelength, and a second color filter disposed on the second lower electrode and configured to transmit light of a second emission wavelength, wherein an optical length between the first light-emitting layer and the first light-reflecting layer is an optical length that causes constructive interference of light of the first emission wavelength, and an optical length between the second light-emitting layer and the second light-reflecting layer is an optical length that causes constructive interference of light of the second emission wavelength.

21. The organic light-emitting device according to claim 12, further comprising a second lower electrode and a third lower electrode that are adjacent to the first lower electrode and between the organic compound layer and the insulating layer,
- a first color filter disposed on the first lower electrode and configured to transmit light of a first emission wavelength, a second color filter disposed on the second lower electrode and configured to transmit light of a second emission wavelength, and a third color filter disposed on the third lower electrode and configured to transmit light of a third emission wavelength, wherein the fourth organic compound layer whose orthogonal projection onto the insulating layer overlaps the first lower electrode is disposed so as to be connected to the fourth organic compound layer whose orthogonal projection onto the insulating layer overlaps the third lower electrode, and
- the fourth organic compound layer whose orthogonal projection onto the insulating layer overlaps the second lower electrode is not connected to the fourth organic compound layer whose orthogonal projection onto the insulating layer overlaps the first lower electrode.

22. The organic light-emitting device according to claim 12, wherein a size of each orthogonal projection onto the insulating layer is a length of the corresponding orthogonal projection onto the insulating layer in a section perpendicular to the insulating layer.

23. The organic light-emitting device according to claim 12,
wherein the device further comprises a second lower electrode adjacent to the first lower electrode, and
wherein the light-emitting layer is disposed such that an orthogonal projection onto the insulating layer extends at least from a region overlapping the first lower electrode to a region overlapping the second lower electrode.

24. A display apparatus comprising the organic light-emitting device according to claim 1, and a signal circuit configured to supply image signals to the organic light-emitting device.

25. A photoelectric conversion apparatus comprising an optical unit including a plurality of lenses, an image pickup element configured to receive light having passed through the optical unit, and a display unit configured to display an image captured by the image pickup element,
wherein the display unit includes the organic light-emitting device according to claim 1.

26. An electronic apparatus comprising a display unit including the organic light-emitting device according to claim 1, a housing including the display unit, and a communication unit disposed in the housing and configured to communicate with an external device.

27. A display apparatus comprising the organic light-emitting device according to claim 12, and a signal circuit configured to supply image signals to the organic light-emitting device.

28. A photoelectric conversion apparatus comprising an optical unit including a plurality of lenses, an image pickup element configured to receive light having passed through the optical unit, and a display unit configured to display an image captured by the image pickup element,
wherein the display unit includes the organic light-emitting device according to claim 12.

29. An electronic apparatus comprising a display unit including the organic light-emitting device according to claim 12, a housing including the display unit, and a communication unit disposed in the housing and configured to communicate with an external device.

* * * * *